(12) United States Patent
Greene et al.

(10) Patent No.: US 8,993,389 B2
(45) Date of Patent: Mar. 31, 2015

(54) DUMMY GATE INTERCONNECT FOR SEMICONDUCTOR DEVICE

(71) Applicant: International Business Machines Corporation, Armonk, NY (US)

(72) Inventors: Brian J. Greene, Wappingers Falls, NY (US); Yue Liang, San Jose, CA (US); Xiaojun Yu, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/734,012

(22) Filed: Jan. 4, 2013

(65) Prior Publication Data

US 2014/0191295 A1 Jul. 10, 2014

(51) Int. Cl.
 H01L 21/338 (2006.01)
 H01L 21/28 (2006.01)
 H01L 29/78 (2006.01)

(52) U.S. Cl.
 CPC .............. *H01L 21/28* (2013.01); *H01L 29/78* (2013.01)
 USPC ........................................................ 438/183

(58) Field of Classification Search
 CPC ................ H01L 27/3223; H01L 29/66545; H01L 29/66606; H01L 29/66871; H01L 21/28525; H01L 21/28537
 USPC ......... 438/183, 321, 532, 533, 655, 682, 724, 438/725, 738, 740, 744, 755, 580–583, 438/647–651
 See application file for complete search history.

(56) References Cited

U.S. PATENT DOCUMENTS

| 5,252,502 | A | 10/1993 | Havemann |
| 5,960,270 | A | 9/1999 | Misra et al. |
| 6,204,137 | B1 | 3/2001 | Teo et al. |
| 6,303,447 | B1 | 10/2001 | Chhagan et al. |
| 6,627,528 | B1 | 9/2003 | Ishimaru |
| 2007/0122952 | A1* | 5/2007 | Kim ............................ 438/183 |
| 2009/0042348 | A1* | 2/2009 | Yamamoto ................... 438/275 |
| 2011/0079827 | A1 | 4/2011 | Ellis-Monaghan et al. |
| 2011/0195557 | A1* | 8/2011 | Teo et al. ..................... 438/384 |
| 2012/0070952 | A1 | 3/2012 | Hsu et al. |
| 2012/0223397 | A1* | 9/2012 | Yang et al. .................. 257/411 |
| 2013/0249010 | A1* | 9/2013 | Ng et al. ....................... 257/369 |

* cited by examiner

*Primary Examiner* — Fernando L Toledo
*Assistant Examiner* — Christine C Lau
(74) *Attorney, Agent, or Firm* — Cantor Colburn LLP; Yuanmin Cai

(57) ABSTRACT

A method of forming a semiconductor device comprising a dummy gate interconnect includes forming a dummy gate on a substrate, the dummy gate comprising a dummy gate metal layer located on the substrate, and a dummy gate polysilicon layer located on the dummy gate metal layer; forming an active gate on the substrate, the active gate comprising an active gate metal layer located on the substrate, and an active gate polysilicon layer located on the active gate metal layer; and etching the dummy gate polysilicon layer to remove at least a portion of the dummy gate polysilicon layer to form the dummy gate interconnect, wherein the active gate polysilicon layer is not etched during the etching of the dummy gate polysilicon layer.

17 Claims, 23 Drawing Sheets

US 8,993,389 B2

DUMMY GATE INTERCONNECT FOR SEMICONDUCTOR DEVICE

BACKGROUND

This disclosure relates generally to semiconductor device fabrication, and more particularly to formation of interconnects in a semiconductor device using dummy gates.

Semiconductor devices may include both active gates, which are part of active devices such as field effect transistors (FETs), and dummy gates, which are not part of active devices. The dummy gates may be included in various locations in a semiconductor device for various reasons, for example, for across-chip line width variation (ACLV) improvement during device fabrication. In another example, active regions of a semiconductor device may be tucked underneath dummy gates to improve embedded silicon germanium (eSiGe) growth in source/drain regions of the semiconductor device. However, dummy gates may consume layout area in the semiconductor device, and while dummy gates may be helpful during device fabrication, they may not be useful in the final semiconductor device product. In addition, the presence of dummy gates may increase parasitic coupling in the semiconductor device, which may slow down switching signals between active devices.

SUMMARY

In one aspect, a method of forming a semiconductor device comprising a dummy gate interconnect includes forming a dummy gate on a substrate, the dummy gate comprising a dummy gate metal layer located on the substrate, and a dummy gate polysilicon layer located on the dummy gate metal layer; forming an active gate on the substrate, the active gate comprising an active gate metal layer located on the substrate, and an active gate polysilicon layer located on the active gate metal layer; and etching the dummy gate polysilicon layer to remove at least a portion of the dummy gate polysilicon layer to form the dummy gate interconnect, wherein the active gate polysilicon layer is not etched during the etching of the dummy gate polysilicon layer.

In another aspect, a semiconductor device comprising includes an active gate, the active gate comprising an active gate stack comprising an active gate metal layer located on a substrate and an active gate polysilicon layer located on top of the active gate metal layer; and a dummy gate interconnect, the dummy gate interconnect comprising a dummy gate stack comprising a dummy gate metal layer, and wherein the dummy gate stack has a height that is less than a height of the active gate stack.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of dummy gate interconnects for a semiconductor device, and methods of forming dummy gate interconnects for a semiconductor device, are provided, with exemplary embodiments being discussed below in detail. Dummy gates may be converted to local interconnects, or dummy gate interconnects, for use in a semiconductor device. Use of dummy gates to form dummy gate interconnects reduces the amount of space needed to form wiring layers for the semiconductor device. Such dummy gate interconnects may reduce parasitic coupling and coupling noise that may be otherwise induced by the presence of dummy gates in the semiconductor device. The dummy gate interconnects may have a reduced gate stack height as compared to the active gates, as some or all of the gate polysilicon is removed from the gate stack in the dummy gates to form the dummy gate interconnects. In various embodiments, a protective layer, which may comprise an optically dispersive layer (ODL), a conformal etch stop material, or planarized etch stop material, may be used to protect the semiconductor device so that the gate polysilicon in the dummy gates may be fully or partially removed without damaging other features of the semiconductor device. Formation of dummy gate interconnects may be performed in conjunction with any appropriate gate fabrication process.

Figure 1:
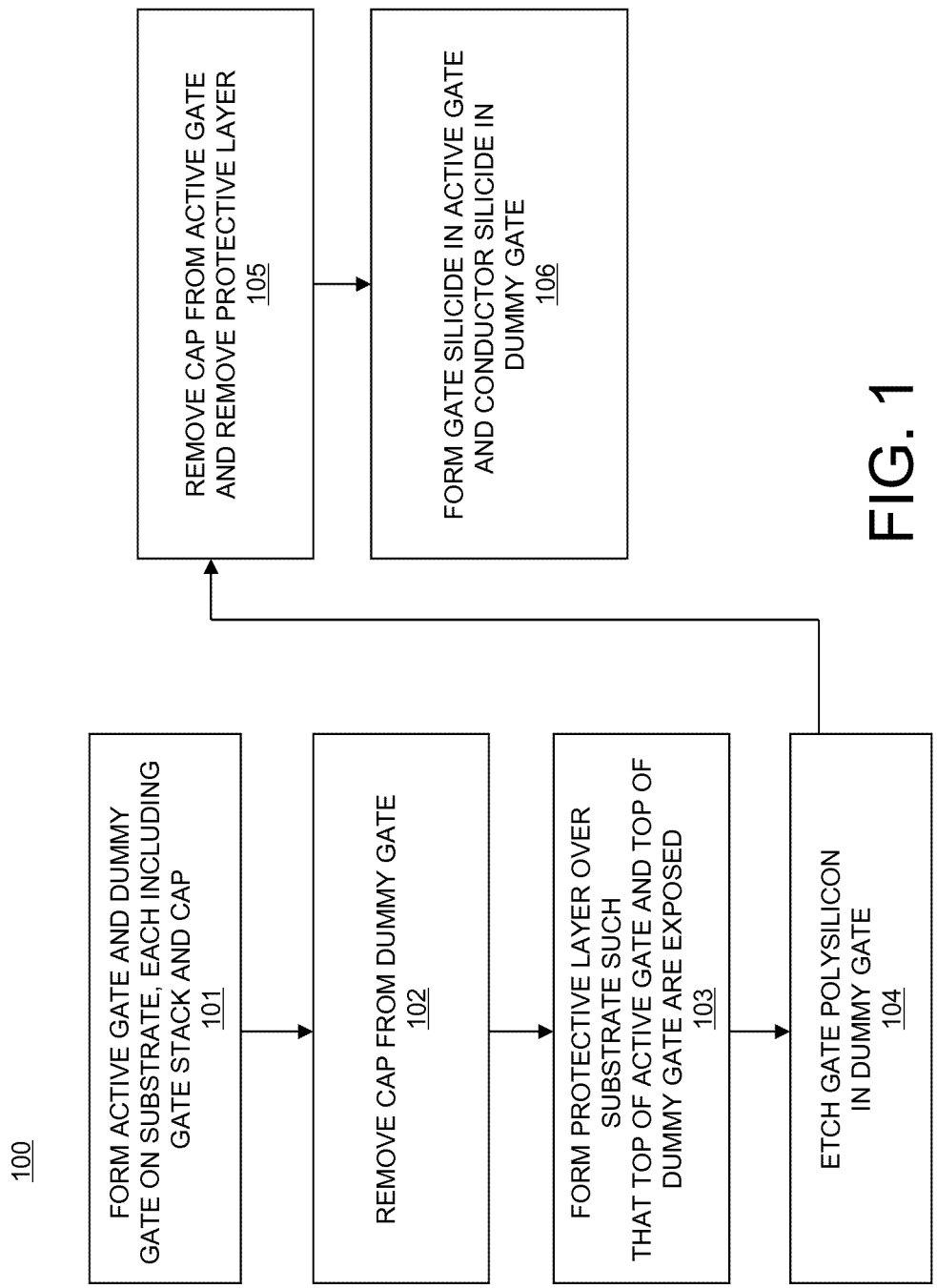
FIG. 1 is a flowchart of an embodiment of a method for formation of a dummy gate interconnect for a semiconductor device.
Figure 2:
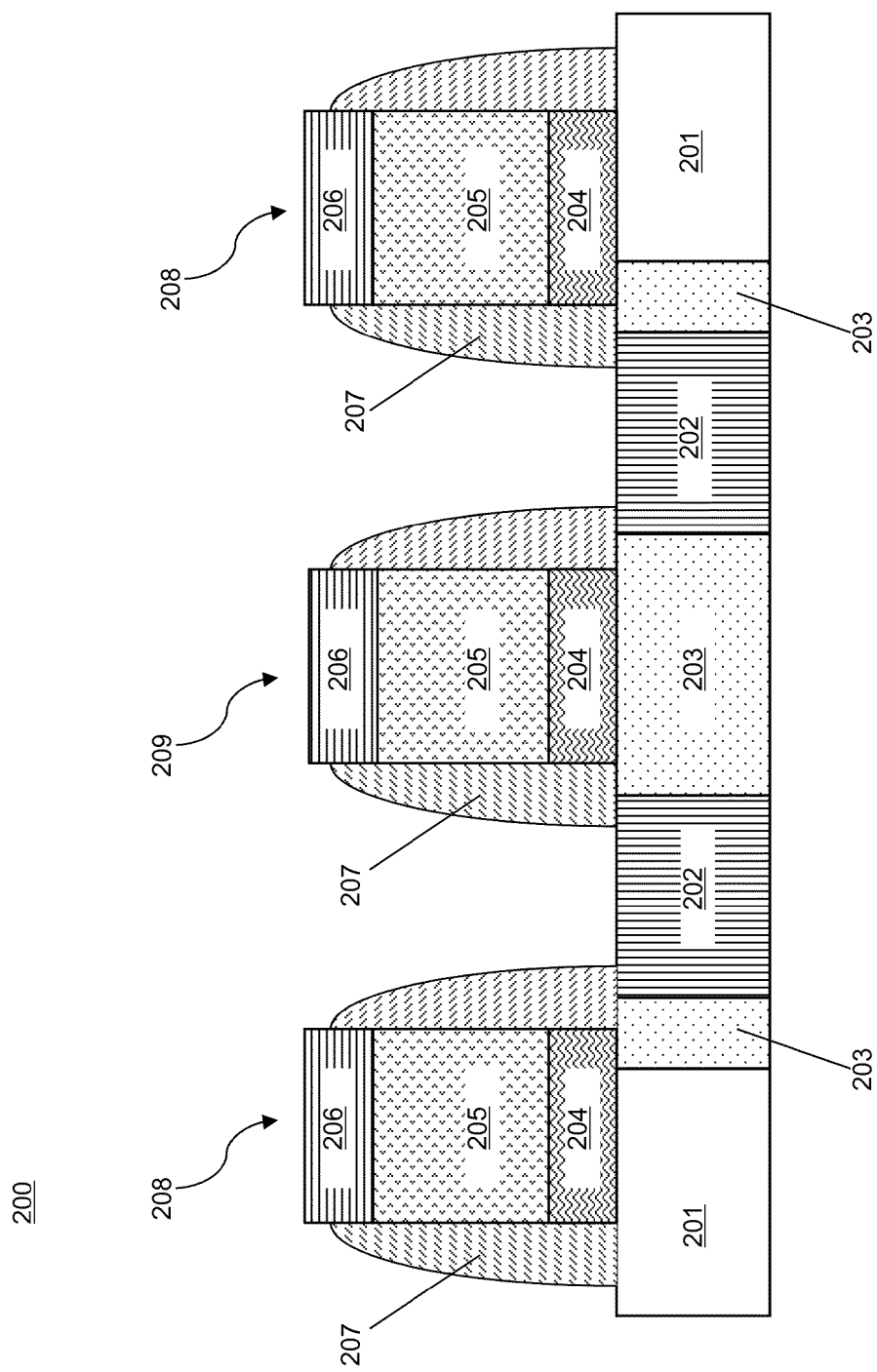
FIG. 2 is a cross sectional view of an embodiment of an active gate and dummy gates with caps on a substrate.

FIG. 1 is a flowchart of a first embodiment of a method 100 for formation of a dummy gate interconnect for a semiconductor device. FIG. 1 is discussed with respect to FIGS. 2-7. First, in block 101 of FIG. 1, a semiconductor device including an active gate and a dummy gate is formed. The active gate and the dummy gate may be formed on a silicon substrate that includes active regions and shallow trench isolation (STI) regions. The active gate may be located on an active region, while the dummy gate may overlap one or more STI regions. The active regions may be located partially underneath a dummy gate in some embodiments. The active gate and dummy gate may each include a respective gate stack including a gate metal layer located on the substrate and a gate polysilicon region located on top of the gate metal layer, a cap located on top of the gate stack, and spacers located on either side of the gate stack. The cap and spacers may comprise nitride. FIG. 2 shows an embodiment of a device 200 including dummy gates 208 and active gate 209 on a substrate. The substrate includes STI regions 201, active regions 203, and source/drain regions 202, which may comprise eSiGe in some embodiments. The dummy gates 208 partially overlap both STI regions 201 and active regions 203, and the active gate 209 is located on active region 203 between the source/drain regions 202. The dummy gates 208 and active gate 209 each include the gate stack comprising gate metal 204 and gate polysilicon 205, a cap 206, and spacers 207. The gate metal 204 may comprise titanium nitride (TiN) or aluminum nitride (AlN) in some embodiments. In some embodiments, the gate polysilicon 205 in the active gate 209 and dummy gates 208 may additionally include an etch stop layer (not shown), which is discussed in further detail with respect to block 104 of FIG. 1; in such embodiments, the etch stop layer may comprise a layer of TiN located within the polysilicon that comprises gate polysilicon 205. The cap 206 and spacers 207 may comprise nitride. FIG. 2 is shown for illustrative purposes only; method 100 of FIG. 1 may be applied to a device having any appropriate number and configuration of dummy gates and active gates. Further, the active and dummy gates may be located on any appropriate portion of the substrate, and may include any appropriate additional layers in the gate stack in various embodiments.

Figure 3:
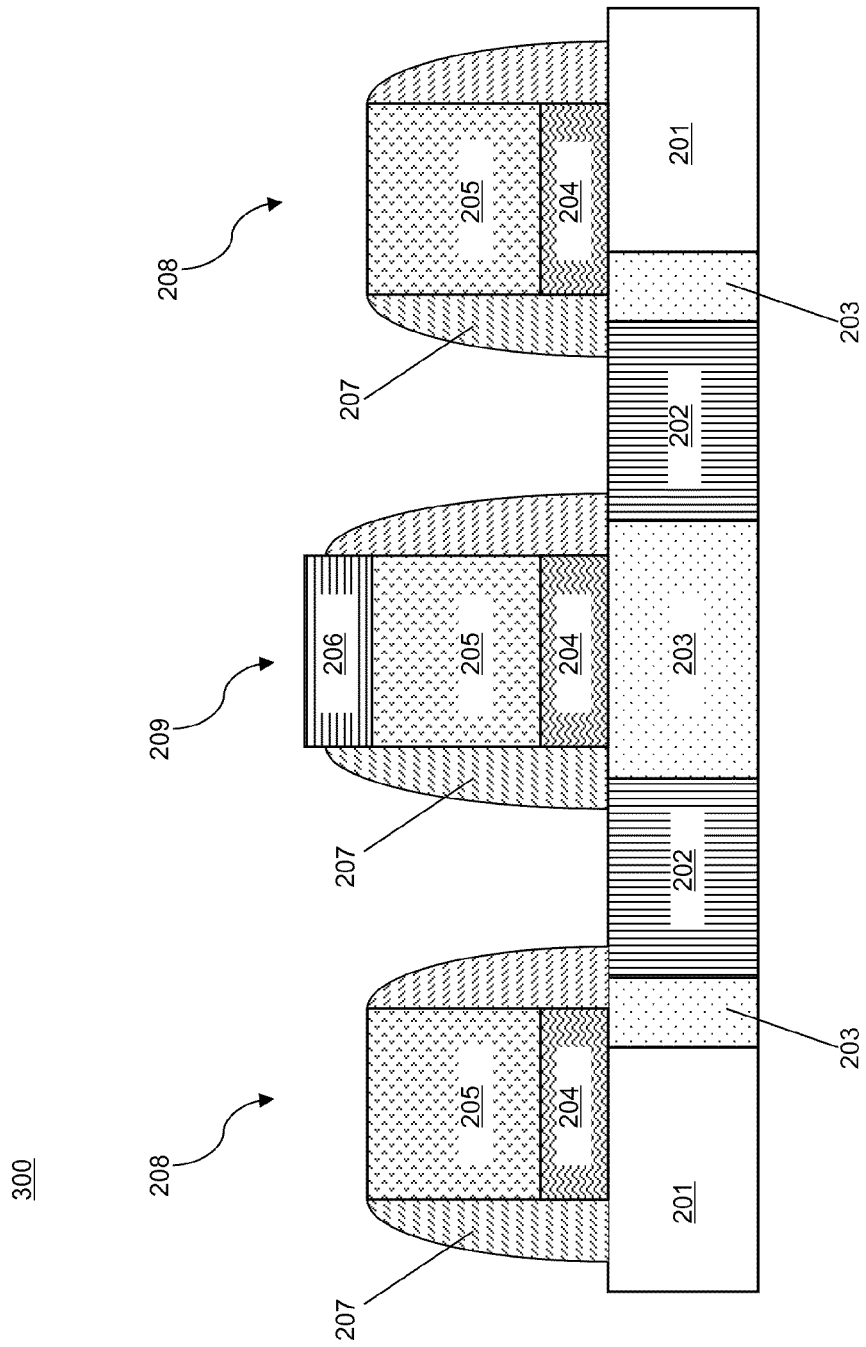
FIG. 3 is a cross sectional view of the device of FIG. 2 after removal of a cap from the dummy gates.

Returning to method 100 of FIG. 1, next, in block 102, the cap is removed from the dummy gate. The cap may be removed from the dummy gate using any appropriate masking and etching process, such that the cap is not removed from the active gate during block 102. A portion of the spacers in the dummy gate may also be removed during removal of the cap in embodiments in which the cap and the dummy gate comprise the same material. FIG. 3 shows the device 200 of FIG. 2 after removal of cap 206 from the dummy gates 208. As shown in device 300 of FIG. 3, the cap 206 remains on the active gate 209. A portion of the spacers 207 is also removed during removal of the cap 206 in the dummy gates 208.

Figure 4:
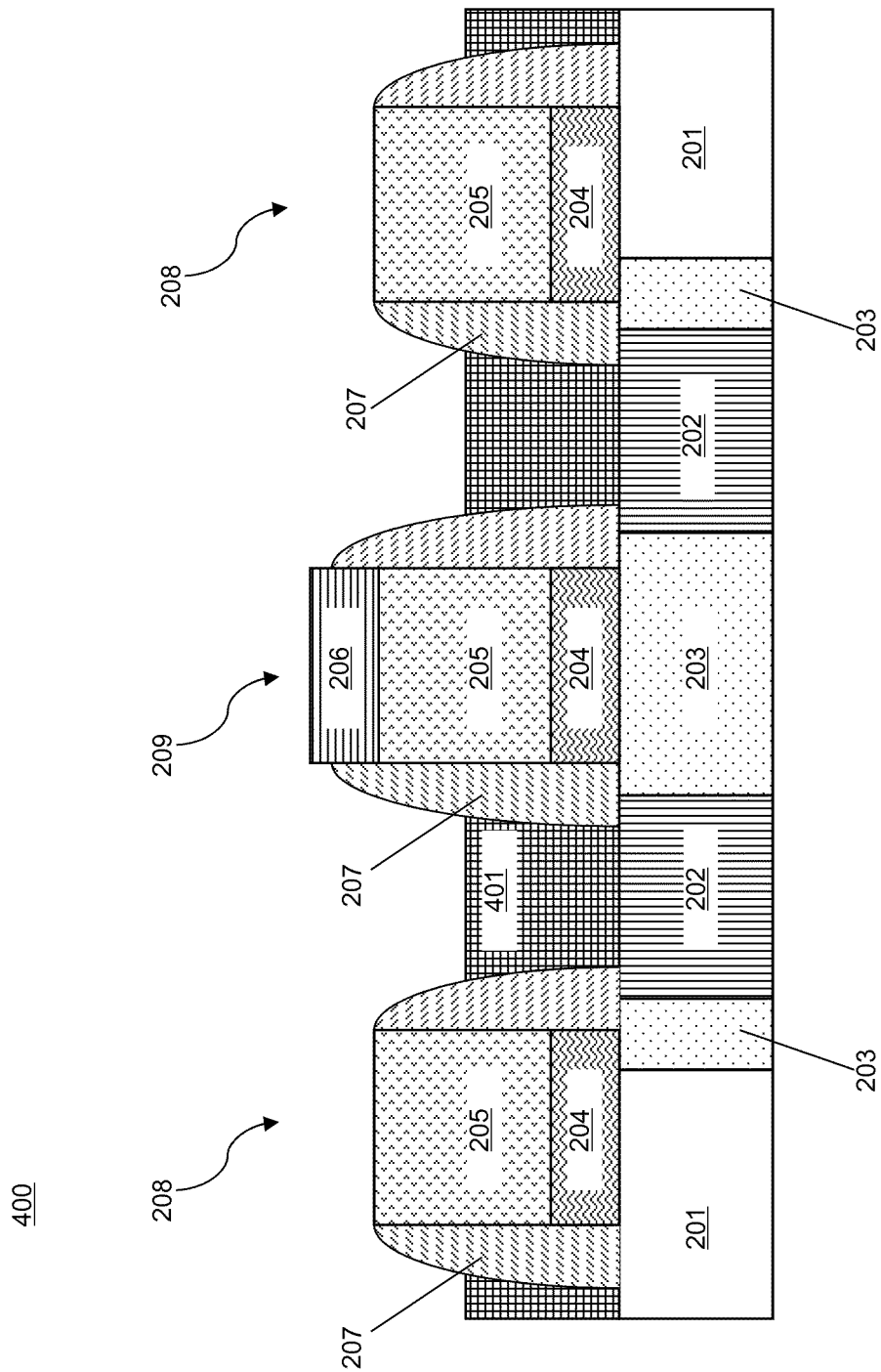
FIG. 4 is a cross sectional view of the device of FIG. 3 after formation of a protective layer over the device.

Next, flow proceeds to block 103 of FIG. 1, in which a protective layer is formed over the device such that the substrate is covered, while the tops of the active and dummy gates are exposed. The protective layer acts to protect the active silicon and source/drain regions in the substrate during etching of the polysilicon in the dummy gates, which is discussed in further detail below with respect to block 104 of FIG. 1. The protective layer may comprise an ODL in some embodiments, which may comprise, for example, a polymer material, and may be applied by spin coating. In other embodiments, the protective layer may comprise a planarized etch stop material, which may comprise, for example, oxide or spun-on glass, and may be formed over the device by deposition or spin coating. In some embodiments, the protective layer may be formed by a two-step process. In such embodiments, an initial layer of the protective layer material is formed over the device such that the active and dummy gates are initially fully covered by the protective layer, and the initial layer of the protective layer material is subsequently etched back to form the protective layer such that the substrate is covered, while the tops of the active and dummy gates are exposed. In other embodiments, the protective layer may be formed having an initial thickness that is less than a height of the dummy gate and the active gate, such that the tops of the active and dummy gates are not covered by the protective layer, and no etchback is necessary. FIG. 4 shows the device 300 of FIG. 3 after formation of a protective layer 401 over the device 300. Protective layer 401 covers the substrate, including STI regions 201, source/drain regions 202, and active regions 203, while exposing the tops of dummy gates 208 and active gate 209 for subsequent processing.

Figure 5:
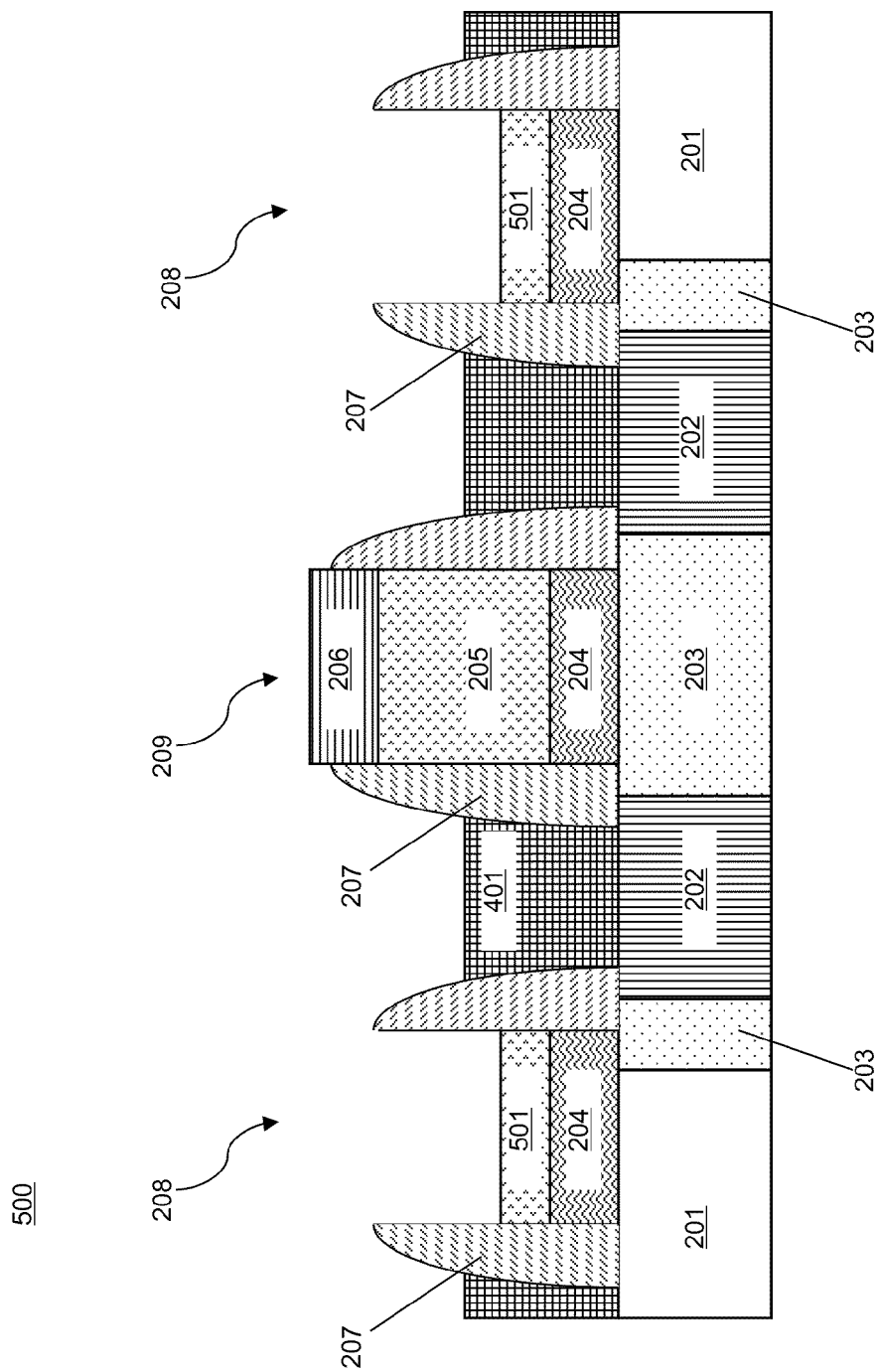
FIG. 5 is a cross sectional view of the device of FIG. 4 after etching of gate polysilicon in the dummy gates.

Flow of method 100 then proceeds to block 104, in which the gate polysilicon in the dummy gate is etched. A portion of the gate polysilicon remains in the dummy gate after the etch of block 104. The thickness of the remaining gate polysilicon in the dummy gate may be controlled by the etching time in some embodiments. In other embodiments, an etch stop layer may be included within the gate polysilicon in both the active gate and dummy gate, and the portion of the gate polysilicon that is located on top of the etch stop layer is removed by the etch of the gate polysilicon in the dummy gate. The etch stop layer may comprise TiN in some embodiments. In further embodiments, the gate polysilicon in the dummy gates may be fully removed during the etch of block 104 of method 100. FIG. 5 shows the device 400 of FIG. 4 after etching of the gate polysilicon 205 in the dummy gates 208 to form conductor polysilicon 501. The thickness of conductor polysilicon 501 may be determined by the etching time of the etch that is performed in block 104 of method 100 in some embodiments, or by the presence of an etch stop layer in the gate polysilicon 205 in other embodiments. In embodiments that include an etch stop layer within the active and dummy gates, the etch stop layer may also be removed from the dummy gates 208 during block 104, leaving conductor polysilicon 501. The thickness of the conductor polysilicon 501 may be chosen such that it is capable of being substantially completely converted to a silicide.

Figure 6:
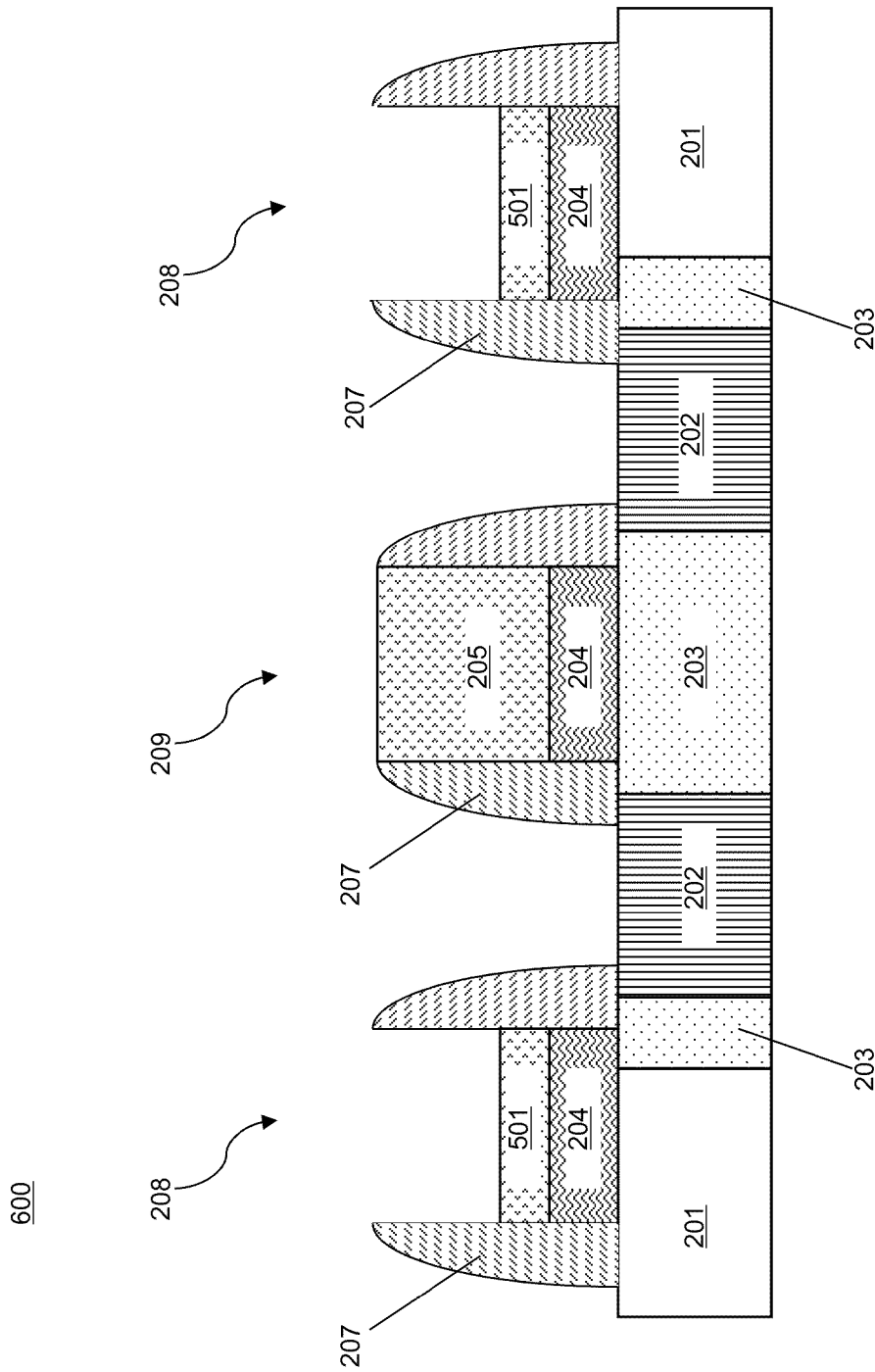
FIG. 6 is a cross sectional view of the device of FIG. 5 after removal of a cap from the active gate and removal of the protective layer.

Returning to method 100 of FIG. 1, next, in block 105, the cap is removed from the active gate. The cap may be removed from the active gate using any appropriate masking and etching process, such that the dummy gate is not affected by removal of the cap from the active gate. A portion of the spacers in the active gate may also be removed during removal of the cap. In some embodiments, the protective layer is also removed during block 105 of FIG. 1; in other embodiments, the protective layer may be left on the device. The protective layer may be removed using any appropriate removal process. FIG. 6 shows the device 500 of FIG. 5 after removal of cap 206 from the active gate 209 and removal of protective layer 401. A portion of the spacers 207 is also removed during removal of the cap 206 in the active gate 208.

Figure 7:
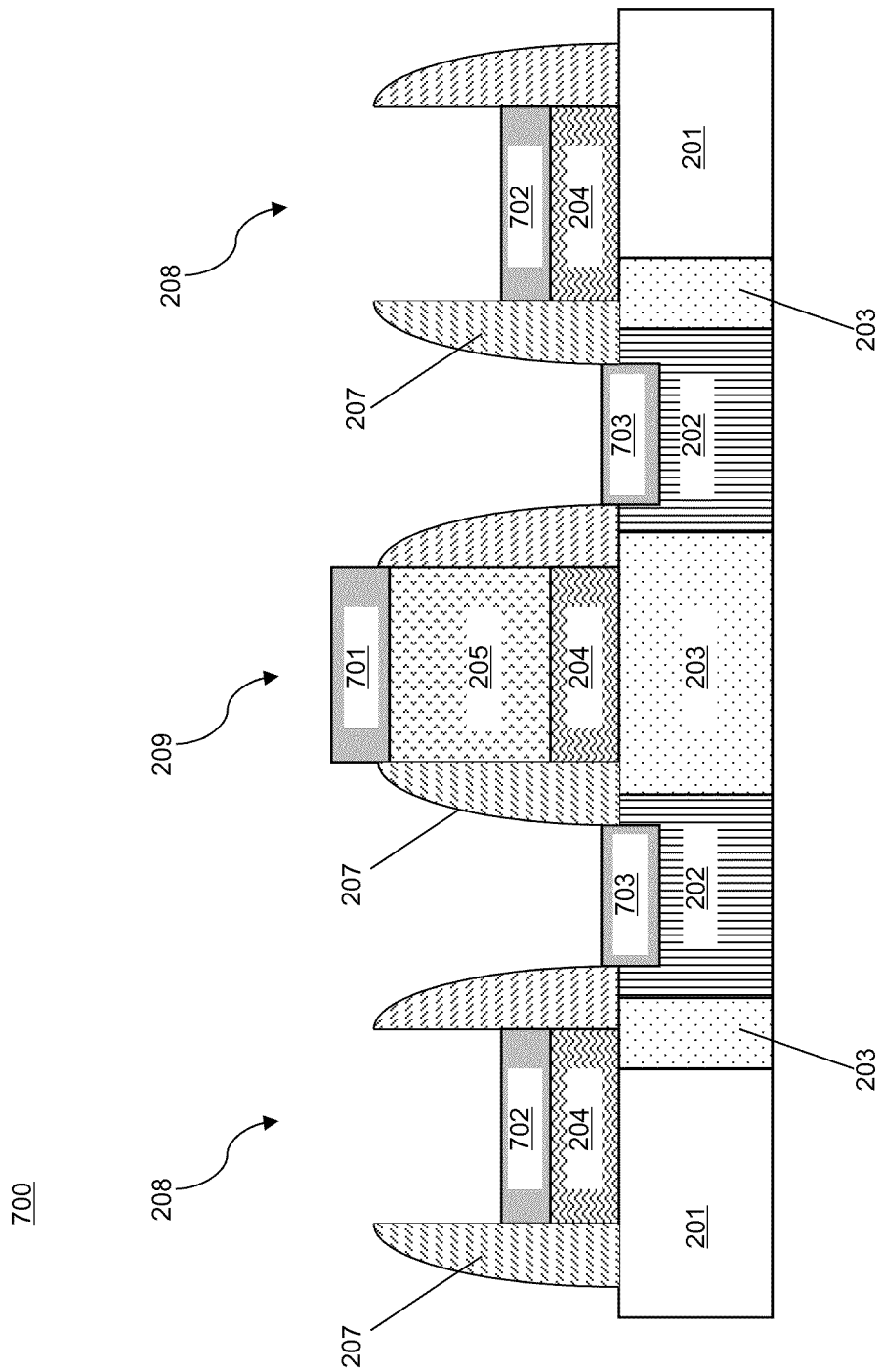
FIG. 7 is a cross sectional view of the device of FIG. 6 after formation of gate silicide in the active gate and conductor silicide in the dummy gates.

Lastly, in block 106 of FIG. 1, the device is silicided to simultaneously form gate silicide in the active gate and conductor silicide in the dummy gate. In some embodiments, the silicidation process may comprise deposition of a metal (for example, nickel or nickel platinum) over the device, annealing of the device and deposited metal such that the deposited metal reacts with silicon to form silicide, and then removing any unreacted metal. In some embodiments, in which the protective layer was removed during block 105 of FIG. 1, the silicidation of block 106 of FIG. 1 may also form source/drain silicide in the source/drain regions in the substrate on either side of the active gate simultaneously with the gate silicide in the active gate and conductor silicide in the dummy gate. In other embodiments, in which the protective layer was not removed during block 105 of FIG. 1, the silicidation of block 106 of FIG. 1 may only form gate silicide in the active gates, and source/drain silicide is not formed in the source/drain regions during block 106. FIG. 7 shows the device 600 of FIG. 6 after formation of gate silicide 701 in the active gate 209 and conductor silicide 702 in the dummy gates 208. In the active gate 209, gate silicide 701 comprises a portion of the gate polysilicon 205 that is reacted with the deposited metal during the silicidation of block 106 of FIG. 1. In the dummy gates 208, conductor polysilicon 501 (as was shown in FIGS. 5 and 6) is fully consumed by the silicidation to form the conductor silicide 702, such that conductor silicide 702 is located directly on top of the gate metal 204 in the dummy gates 208. In the embodiment shown in FIG. 7, source/drain silicide 703 is also formed in source/drain regions 202 by the silicidation performed during block 106. However, in embodiments in which the protective layer 401 was not removed during block 105 of method 100, the source/drain regions 202 are covered by the protective layer 401 during silicidation, and source/drain silicide 703 would not be formed during block 106 of method 100. The dummy gates 208, including a conductor comprising gate metal 204 and conductor silicide 702, comprise dummy gate interconnects that may be used as local interconnects for the device 700, and that may used to be transmit any appropriate signals in the finished semiconductor device 700.

Figure 8:
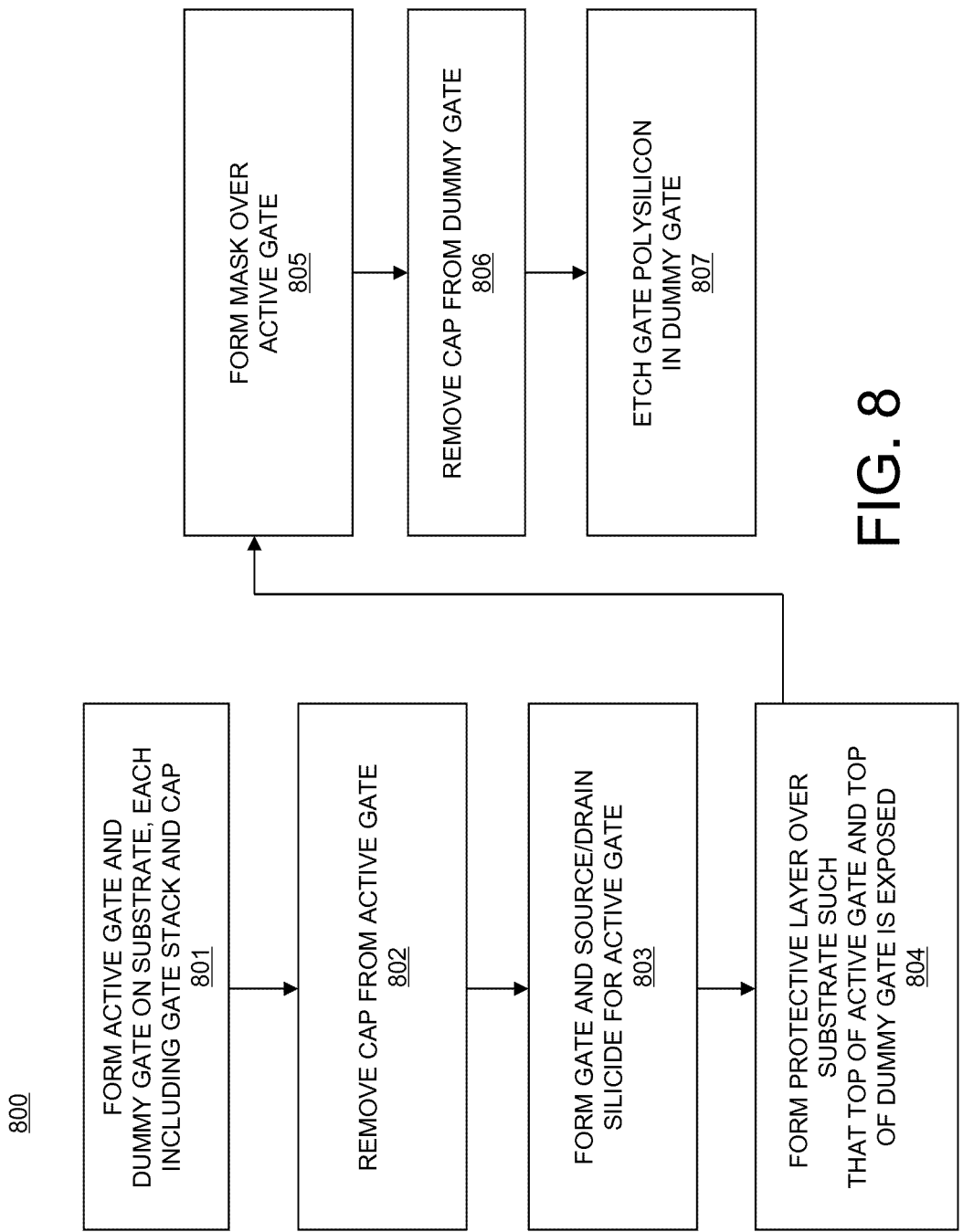
FIG. 8 is a flowchart of another embodiment of a method for formation of a dummy gate interconnect for a semiconductor device.
Figure 9:
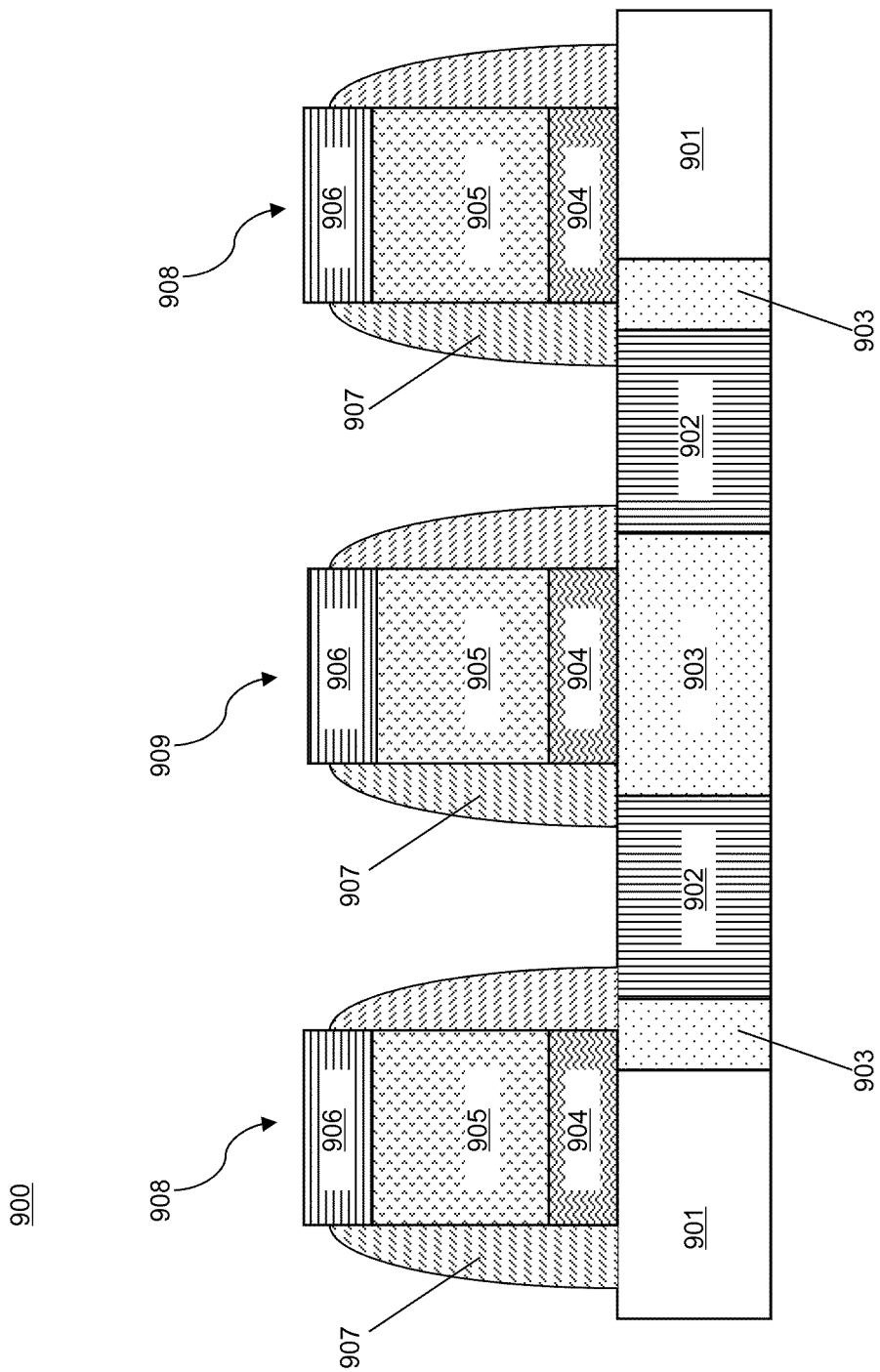
FIG. 9 is a cross sectional view of an embodiment of an active gate and dummy gates with caps on a substrate.

FIG. 8 is a flowchart of a second embodiment of a method 800 for formation of a dummy gate interconnect for a semiconductor device. FIG. 8 is discussed with respect to FIGS. 9-15. First, in block 801 of FIG. 8, a semiconductor device including an active gate and a dummy gate is formed. The active gate and the dummy gate may be formed on a silicon substrate that includes active regions and shallow trench isolation (STI) regions. The active gate may be located on an active region, while the dummy gate may overlap one or more STI regions. The active regions may be located partially underneath a dummy gate in some embodiments. The active gate and dummy gate may each include a respective gate stack including a gate metal layer located on the substrate and a gate polysilicon region located on top of the gate metal layer, a cap located on top of the gate stack, and spacers located on either side of the gate stack. The cap and spacers may comprise nitride. The gate metal may be relatively thick, having a thickness from about 5 nanometers (nm) to about 10 nm in some embodiments, or greater than about 10 nm in some embodiments. FIG. 9 shows an embodiment of a device 900 including dummy gates 908 and active gate 909 on a substrate. The substrate includes STI regions 901, active regions 903, and source/drain regions 902, which may comprise eSiGe in some embodiments. The dummy gates 908 partially overlap both STI regions 901 and active regions 903, and the active gate 909 is located on an active region 903 between the source/drain regions 902. The dummy gates 908 and active gate 909 each include the gate stack comprising gate metal 904 and gate polysilicon 905, a cap 906, and spacers 907. The gate metal 904 may comprise TiN or AlN in some embodiments. The cap 906 and spacers 907 may comprise nitride. FIG. 9 is shown for illustrative purposes only; method 800 of FIG. 8 may be applied to a device having any appropriate number and configuration of dummy gates and active gates. Further, the active and dummy gates may be located on any appropriate portion of the substrate, and may include any appropriate additional layers in the gate stack in various embodiments.

Figure 10:
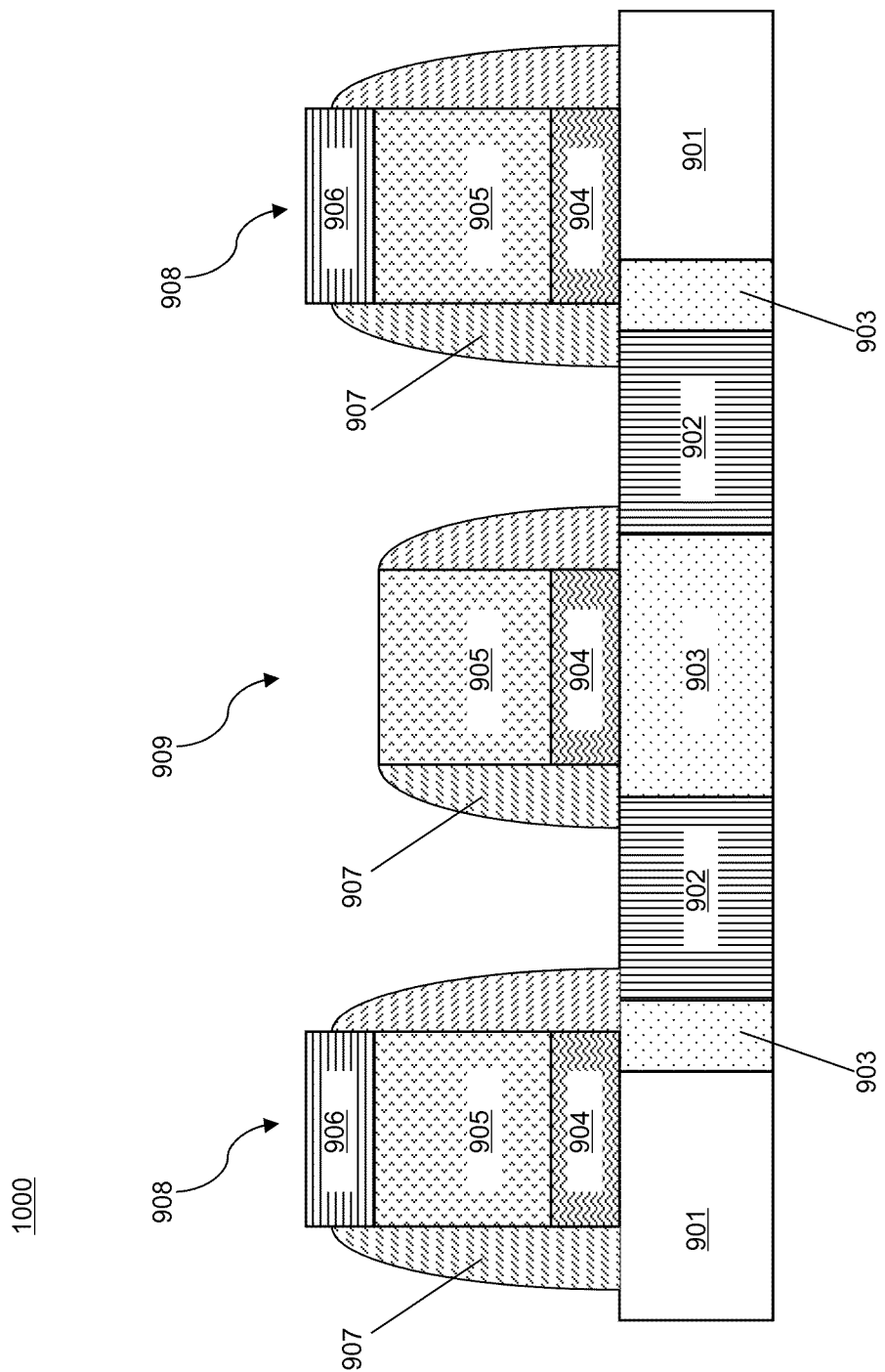
FIG. 10 is a cross sectional view of the device of FIG. 9 after removal of a cap from the active gate.

Next, flow of method 800 of FIG. 8 proceeds to block 802, in which the cap is removed from the active gate. The cap may be removed from the active gate using any appropriate masking and etching process, such that the cap is not removed from the dummy gate during block 802. A portion of the spacers in the active gate may also be removed during removal of the cap. FIG. 10 shows the device 900 of FIG. 9 after removal of cap 906 from the active gate 909. As shown in FIG. 10, the cap 906 remains on the dummy gates 908. A portion of the spacers 907 is also removed during removal of the cap 906 in the active gate 909.

Figure 11:
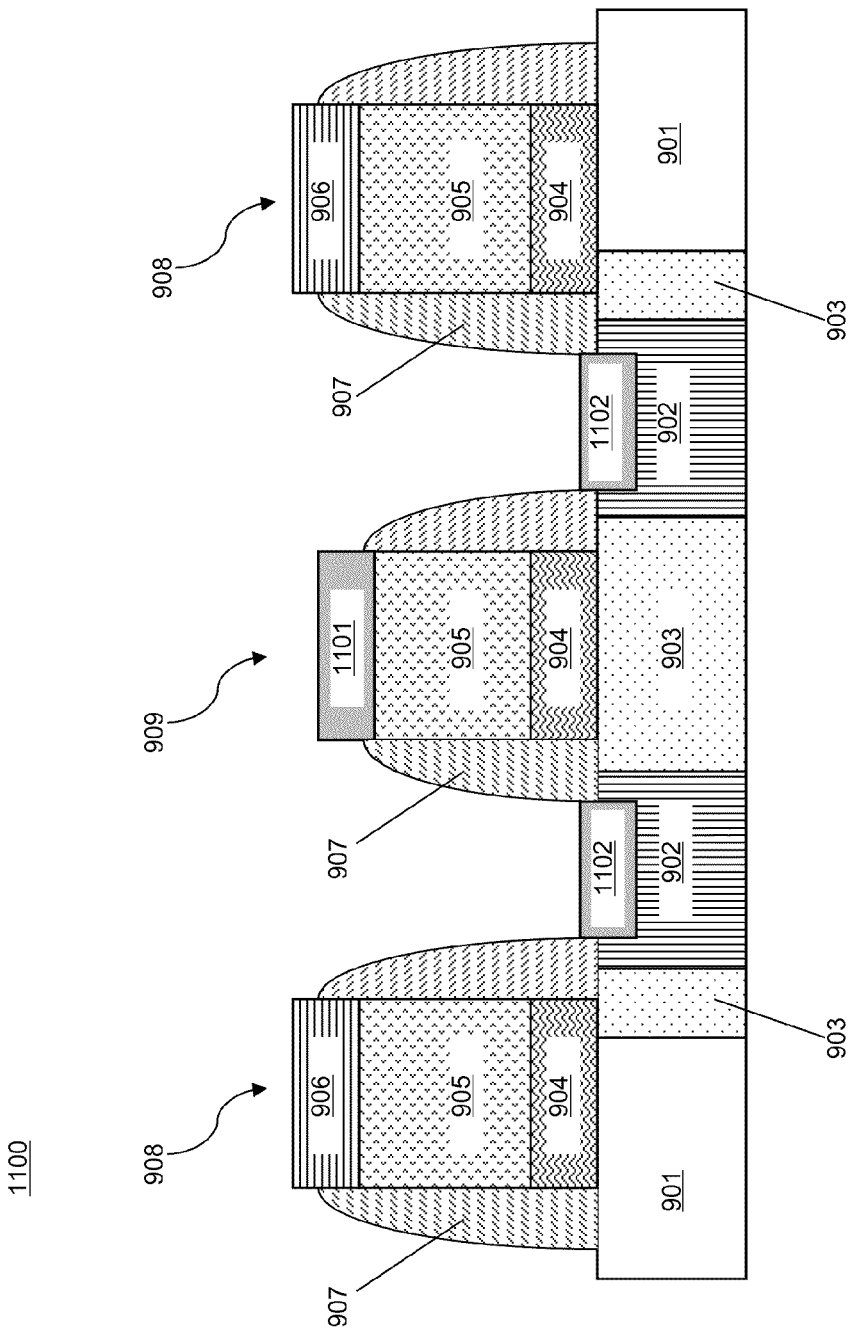
FIG. 11 is a cross sectional view of the device of FIG. 10 after formation of source/drain silicide and gate silicide in the active gate.

Flow now proceeds to block 803 of FIG. 8, in which the device is silicided to simultaneously form gate silicide in the active gate and source/drain silicide in the source/drain regions in the substrate on either side of the active gate. In some embodiments, the silicidation process may comprise deposition of a metal (for example, nickel or nickel platinum) over the device, annealing the device such that the deposited metal reacts with silicon to form the silicide, and then removing any unreacted metal. FIG. 11 shows the device 1000 of FIG. 10 after formation of gate silicide 1101 in the active gate 909 and source/drain silicide 1102 in the source/drain regions 902. Gate silicide 1101 comprises a portion of the gate polysilicon 905 that is reacted with the deposited metal during the silicidation of block 803 of FIG. 8, and source/drain silicide 1102 comprises a portion of source/drain regions 202 that reacted with the deposited metal during the silicidation of block 803 of FIG. 8. No silicide is formed in the dummy gates 908 during block 803 of FIG. 8 due to the presence of the caps 906 and spacers 907.

Figure 12:
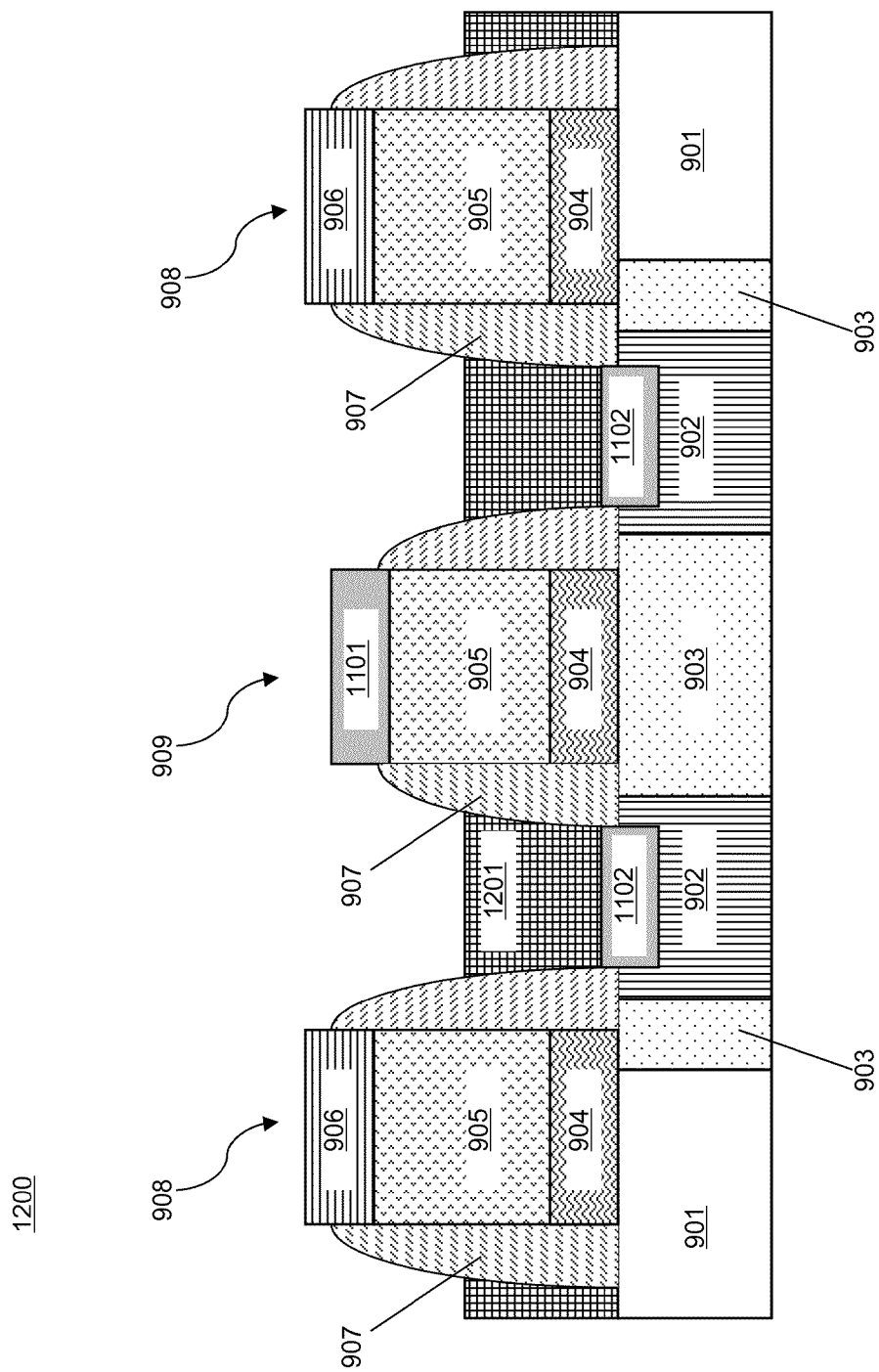
FIG. 12 is a cross sectional view of the device of FIG. 11 after formation of a protective layer over the device.

Next, flow proceeds to block 804 of FIG. 8, in which a protective layer is formed over the device such that the substrate is covered, while the tops of the active and dummy gates are exposed. The protective layer acts to protect the active silicon and source/drain regions in the substrate during etching of the polysilicon in the dummy gates, which is discussed in further detail below with respect to block 807 of FIG. 8. The protective layer may comprise an ODL in some embodiments, which may comprise, for example, a polymer material, and may be applied by spin coating. In other embodiments, the protective layer may comprise a planarized etch stop material, which may comprise, for example, oxide or spun-on glass, and may be formed over the device by deposition or spin coating. In some embodiments, the protective layer may be formed by a two-step process. In such embodiments, an initial layer of the protective layer material is formed over the device such that the active and dummy gates are initially fully covered by the protective layer, and the initial layer of the protective layer material is subsequently etched back to form the protective layer such that the substrate is covered, while the tops of the active and dummy gates are exposed. In other embodiments, the protective layer may be formed having an initial thickness that is less than a height of the dummy gate and the active gate, such that the tops of the active and dummy gates are not covered by the protective layer, and no etchback is necessary. FIG. 12 shows the device

1100 of FIG. 11 after formation of a protective layer 1201. Protective layer 1201 covers the substrate, including STI regions 901, source/drain regions 902, source/drain silicide 1102, and active regions 903, while exposing the tops of dummy gates 908 and active gate 909 for subsequent processing.

Figure 13:
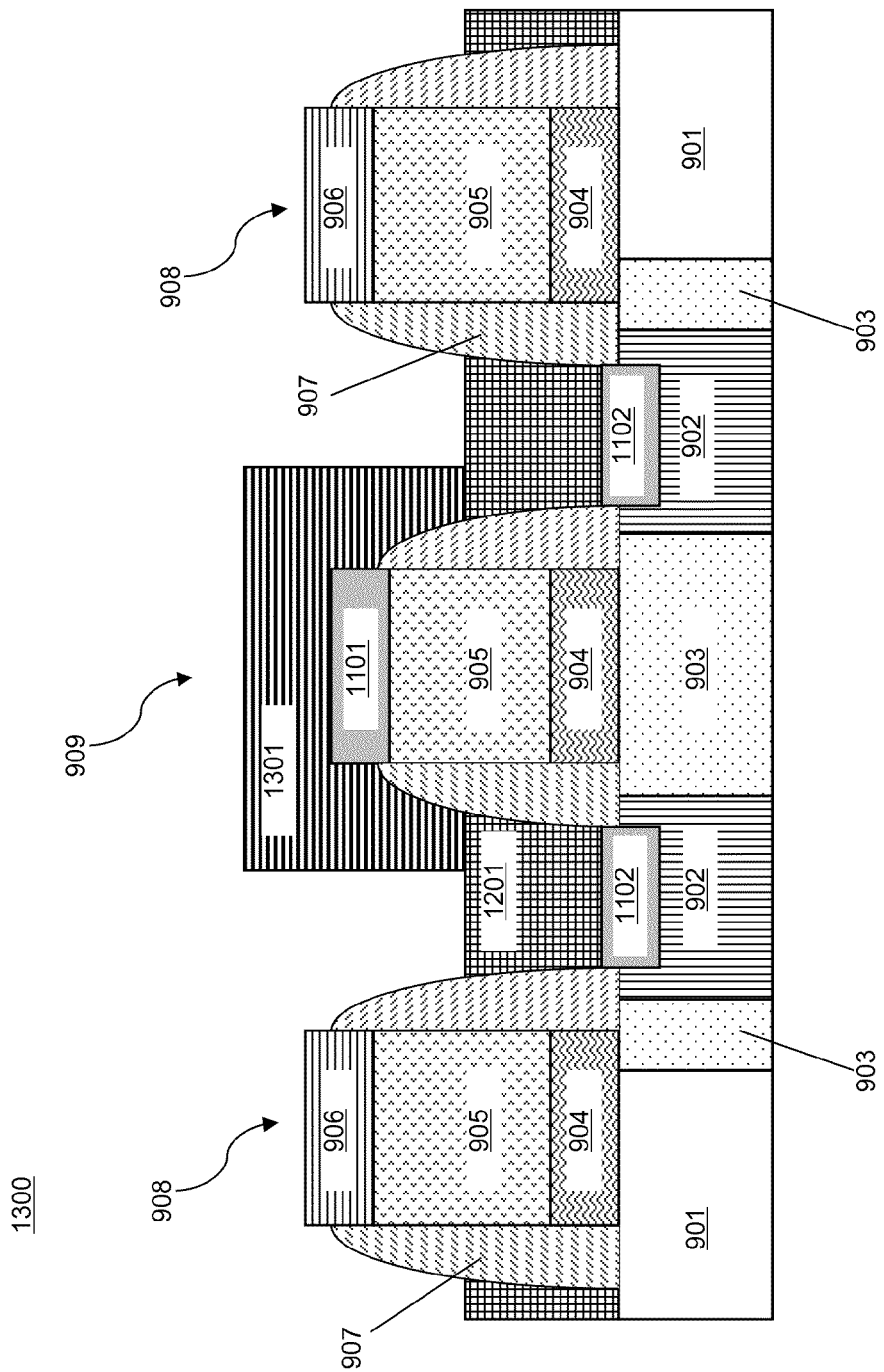
FIG. 13 is a cross sectional view of the device of FIG. 12 after formation of a mask over the active gate.

Then, in block 805 of method 800 of FIG. 8, a mask is formed over the active gate to protect the active gate during subsequent processing. The mask may comprise photoresist in some embodiments, and may be formed in any appropriate manner such that the active gate is covered and the dummy gate is exposed. FIG. 13 shows the device 1200 of FIG. 12 after formation of a mask 1301 over the active gate 909. As shown in FIG. 13, the dummy gates 908 are exposed by the mask 1301.

Figure 14:
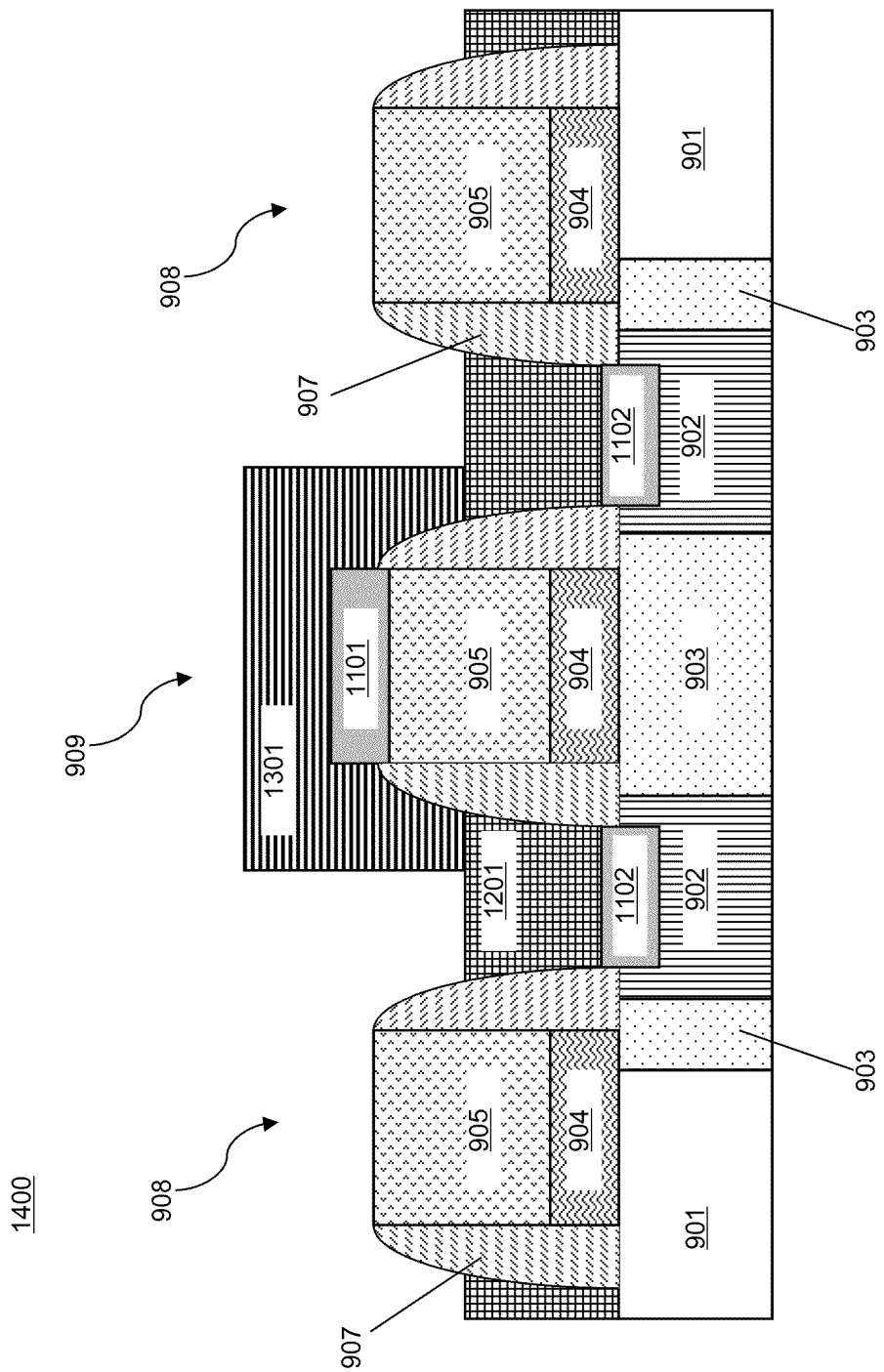
FIG. 14 is a cross sectional view of the device of FIG. 13 after removal of a cap from the dummy gates.

Flow of method 800 now proceeds to block 806, in which the cap is removed from the dummy gate. The mask that was formed in block 805 of method 800 protects the active gate during removal of the cap from the dummy gate. The cap may be removed from the dummy gate using any appropriate etching process. A portion of the spacers in the dummy gate may also be removed during removal of the cap. FIG. 14 shows the device 1300 of FIG. 13 after removal of caps 906 from the dummy gates 908. Mask 1301 protects the active gate 909 during removal of the caps 906 from the dummy gates 908. A portion of the spacers 907 is also removed during removal of the cap 906 in the dummy gates 908.

Figure 15:
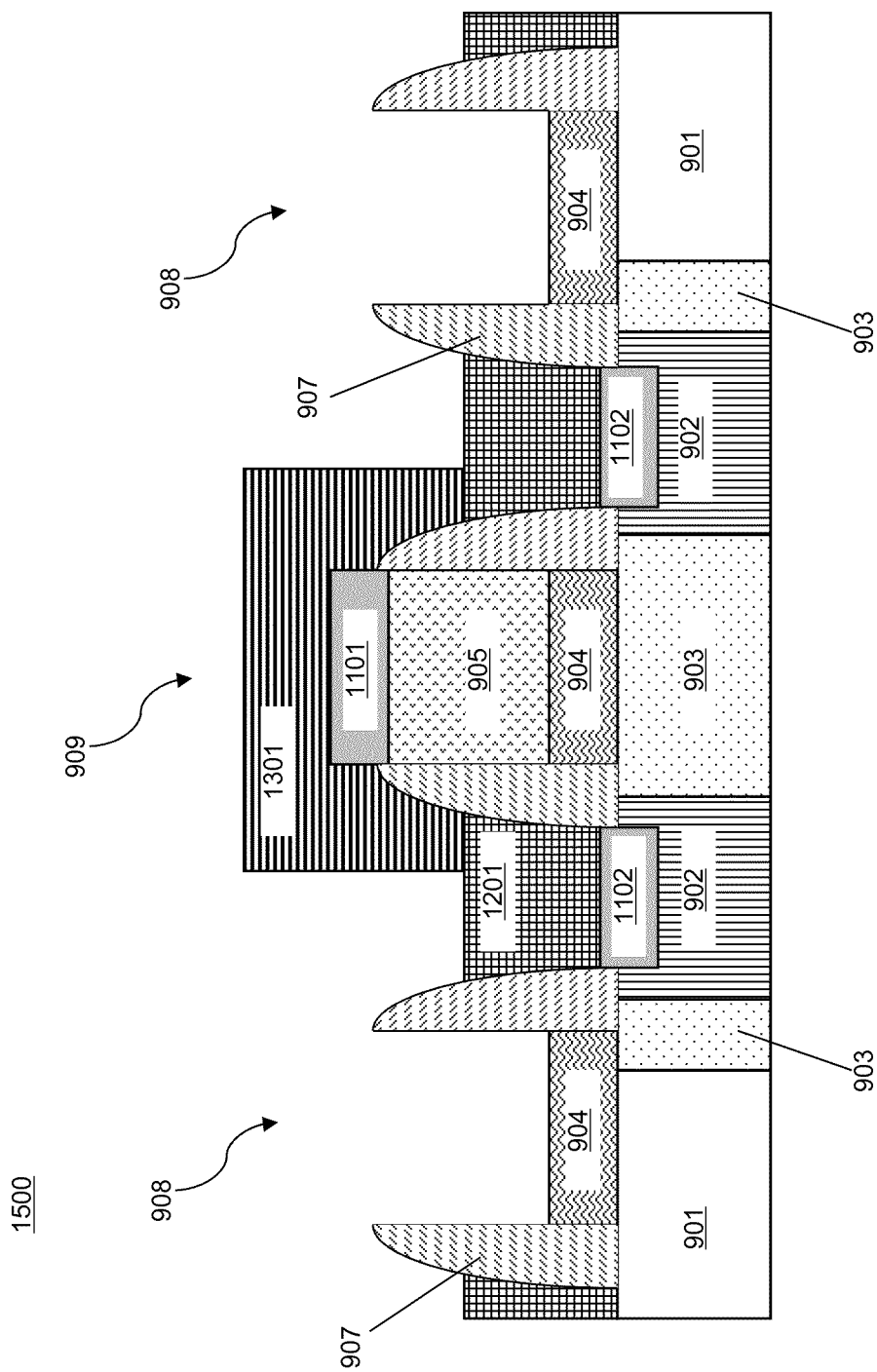
FIG. 15 is a cross sectional view of the device of FIG. 14 after etching of gate polysilicon in the dummy gates.

Lastly, in block 807 of FIG. 8, the gate polysilicon in the dummy gate is etched. During the etch of block 807, the gate polysilicon in the dummy gate may be fully removed in some embodiments, leaving the gate metal in the dummy gates to be used as a conductor for the dummy gate interconnect in the finished semiconductor device. In embodiments in which the gate polysilicon is fully removed, the gate metal in the gate stacks in both the dummy and active gates may be relatively thick, having a thickness from about 5 nm to about 10 nm in some embodiments, or greater than about 10 nm in some embodiments. In other embodiments, the gate polysilicon in the dummy gate may only be partially removed, as determined by etch timing or an etch stop layer located in the gate polysilicon. FIG. 15 shows the device 1400 of FIG. 14 after etching of the gate polysilicon 905 in the dummy gates 908, leaving the gate metal 904. The gate metal 904 may be relatively thick, having a thickness from about 5 nm to about 10 nm in some embodiments, or greater than about 10 nm in some embodiments. The dummy gates 908 comprise dummy gate interconnects that may comprise local interconnects for the device 1500, and may used to be transmit any appropriate signals in the device 1500.

Figure 16:
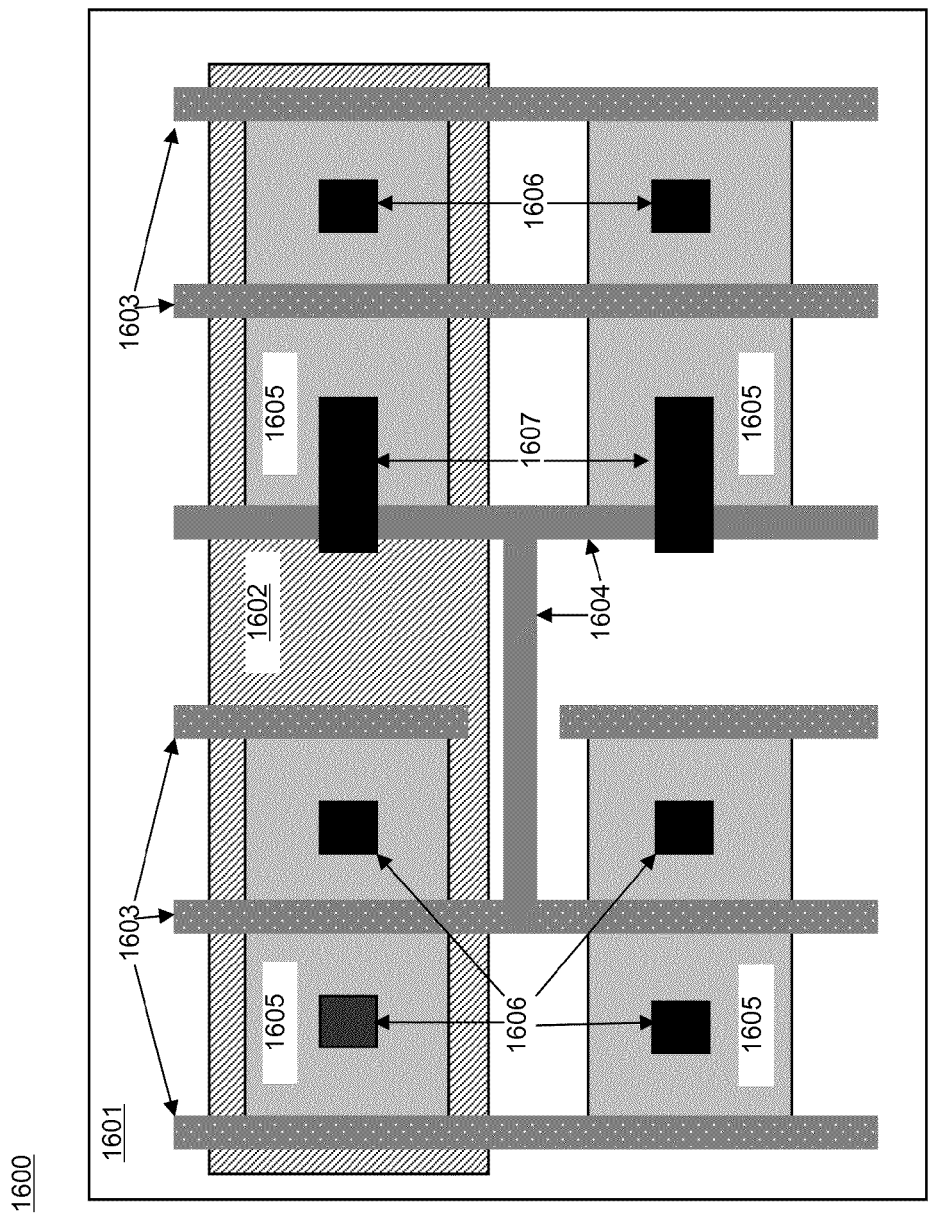
FIG. 16 is a top view of an embodiment of a semiconductor device including dummy gate interconnects.

FIG. 16 illustrates a top view of an embodiment of a semiconductor device 1600 including dummy gate interconnects 1604. The dummy gate interconnects 1604 of FIG. 16 may be formed by method 100 of FIG. 1, method 800 of FIG. 8, or method 1700 of FIG. 17, which is discussed below, in various embodiments. Device 1600 additionally includes STI regions 1601, active regions 1602, active gates 1603, source/drain silicide 1605, and contacts 1606 and 1607. The contacts 1606 and 1607 contact active devices comprising the active regions 1602, active gates 1603, and source/drain silicide 1605 in semiconductor device 1600. The dummy gate interconnects 1604 provide local wiring between active devices in semiconductor device 1600 with low coupling noise and parasitic capacitance. The contacts 1607 are extended to connect the dummy gate interconnects 1604 to the active devices. FIG. 16 is shown for illustrative purposes only; dummy gate interconnects may be included in a semiconductor device having any appropriate configuration.

Figure 17:
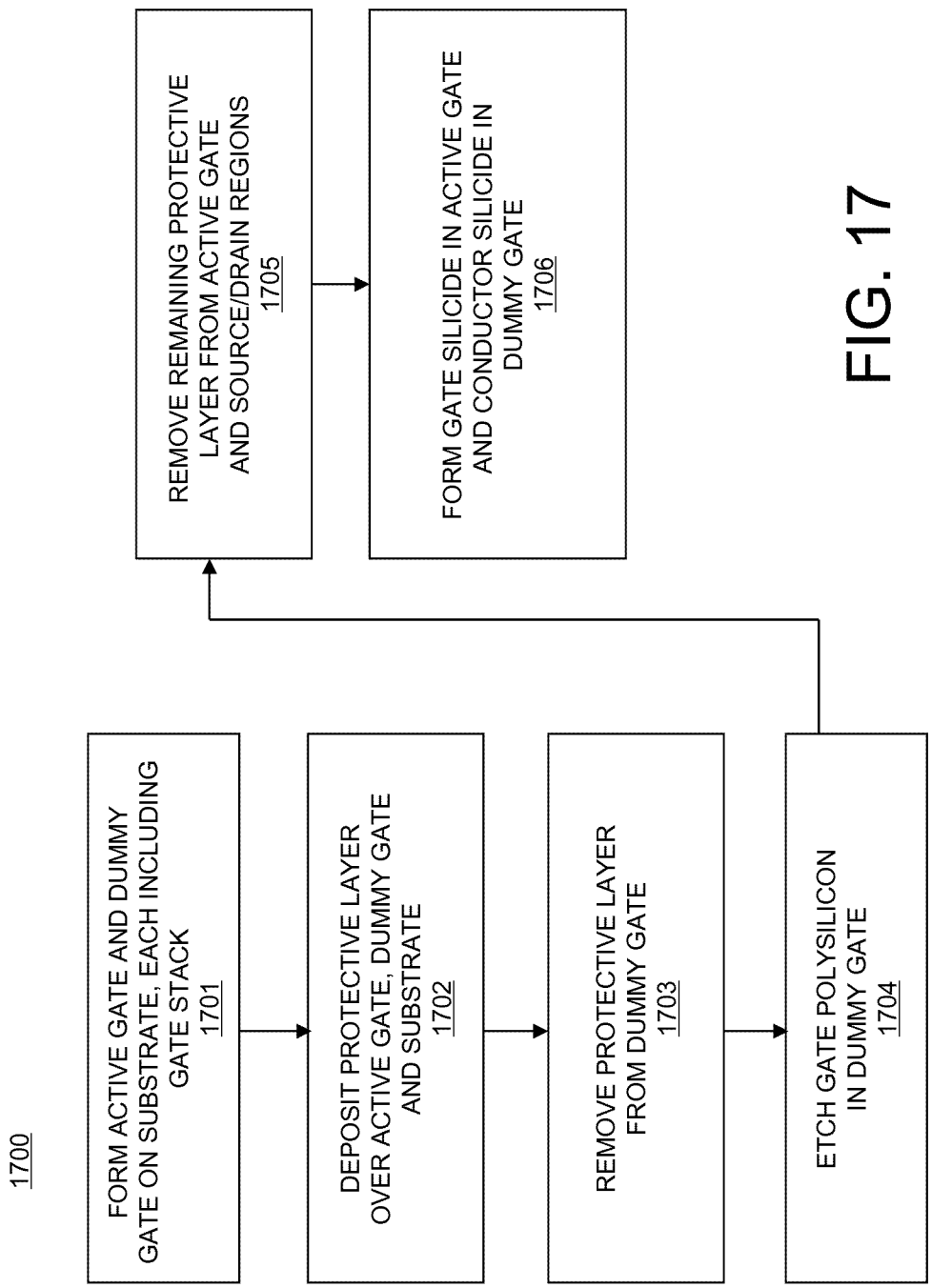
FIG. 17 is a flowchart of another embodiment of a method for formation of a dummy gate interconnect for a semiconductor device.
Figure 18:
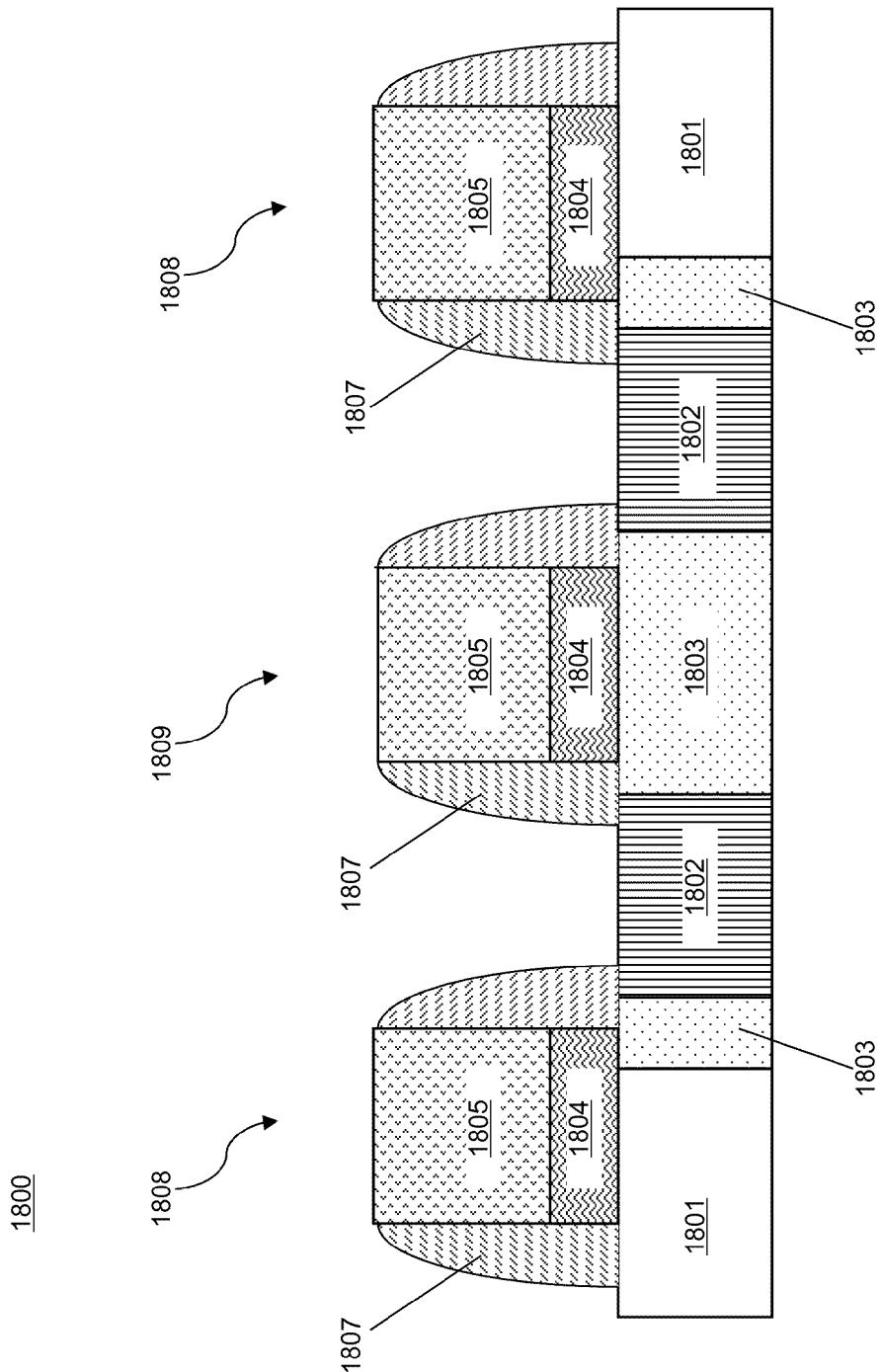
FIG. 18 is a cross sectional view of an embodiment of an active gate and dummy gates without caps on a substrate.

FIG. 17 is a flowchart of a third embodiment of a method 1700 for formation of a dummy gate interconnect for a semiconductor device. In method 1700 of FIG. 17, the caps may be omitted from the active and dummy gate stacks. FIG. 17 is discussed with respect to FIGS. 18-23. First, in block 1701 of FIG. 17, a semiconductor device including an active gate and a dummy gate is formed. The active gate and the dummy gate may be formed on a silicon substrate that includes active regions and shallow trench isolation (STI) regions. The active gate may be located on an active region, while the dummy gate may overlap one or more STI regions. The active regions may be located partially underneath a dummy gate in some embodiments. The active gate and dummy gate may each include a respective gate stack including a gate metal layer located on the substrate and a gate polysilicon region located on top of the gate metal layer, and spacers located on either side of the gate stack. The spacers may comprise nitride. FIG. 18 shows an embodiment of a device 1800 including dummy gates 1808 and active gate 1809 on a substrate. The substrate includes STI regions 1801, active regions 1803, and source/drain regions 1802, which may comprise eSiGe in some embodiments. The dummy gates 1808 partially overlap both STI regions 1801 and active regions 1803, and the active gate 1809 is located on active region 1803 between the source/drain regions 1802. The dummy gates 1808 and active gate 1809 each include the gate stack comprising gate metal 1804 and gate polysilicon 1805, and spacers 1807. The gate metal 1804 may comprise titanium nitride (TiN) or aluminum nitride (AlN) in some embodiments. In some embodiments, the gate polysilicon 1805 in the active gate 1809 and dummy gates 1808 may additionally include an etch stop layer (not shown), which is discussed in further detail with respect to block 1704 of FIG. 17; in such embodiments, the etch stop layer may comprise a layer of TiN located within the polysilicon that comprises gate polysilicon 1805. The spacers 1807 may comprise nitride. FIG. 18 is shown for illustrative purposes only; method 1700 of FIG. 17 may be applied to a device having any appropriate number and configuration of dummy gates and active gates. Further, the active and dummy gates may be located on any appropriate portion of the substrate, and may include any appropriate additional layers in the gate stack in various embodiments.

Figure 19:
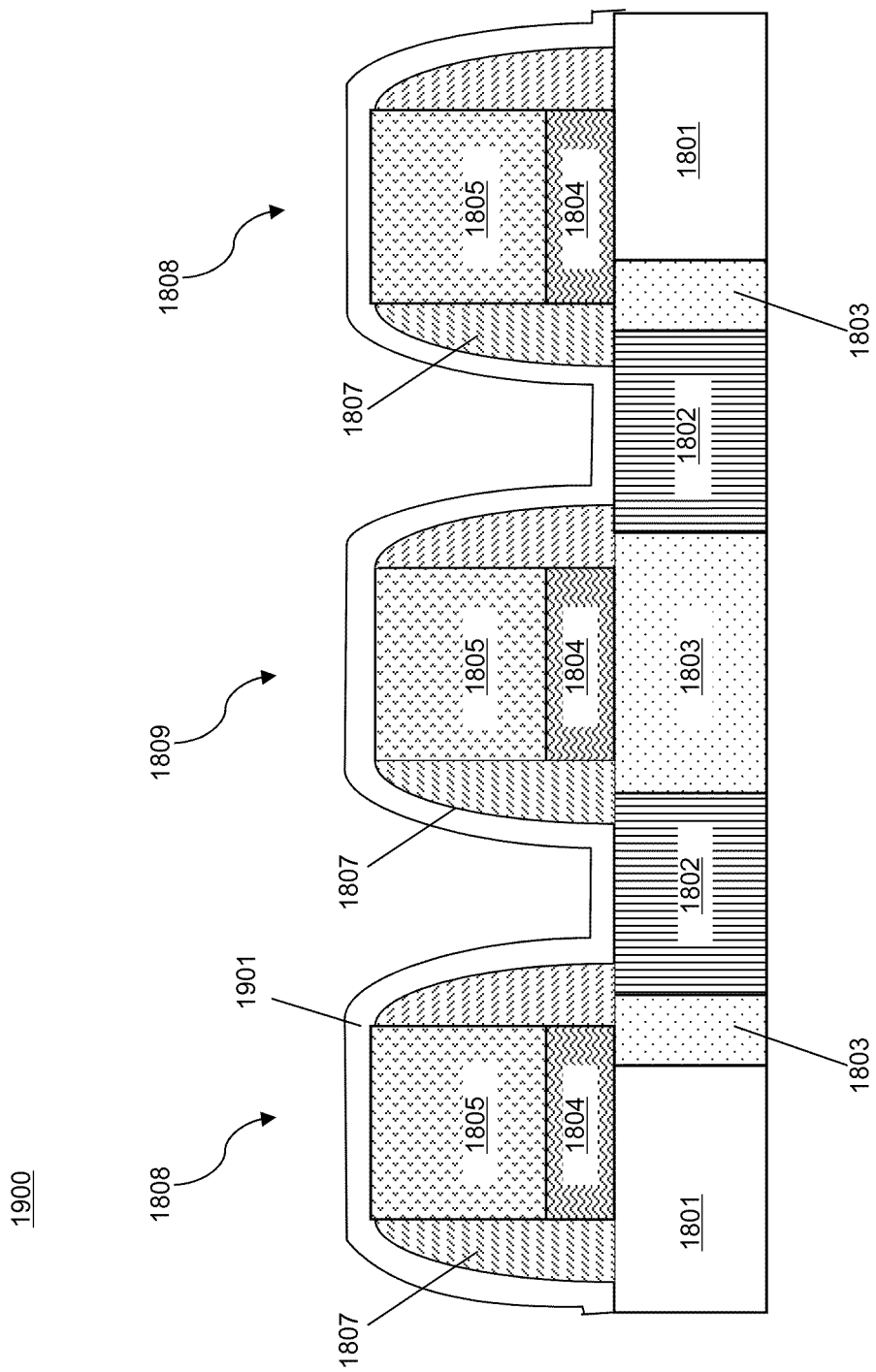
FIG. 19 is a cross sectional view of the device of FIG. 19 after formation of a protective layer over the device.

Flow then proceeds to block 1702 of method 1700, in which a protective layer is formed over the device. The protective layer covers the dummy gates, active gates, and the substrate. The protective layer may comprise an etch stop material, which may comprise, for example, nitride or oxide, and may be formed over the device by conformal deposition. FIG. 19 is a cross sectional view of the device of FIG. 19 after formation of a protective layer 1901 over the device 1800 that was shown in FIG. 18. The protective layer 1901 covers the dummy gates 1808, active gate 1809, and the source/drain regions 1802.

Figure 20:
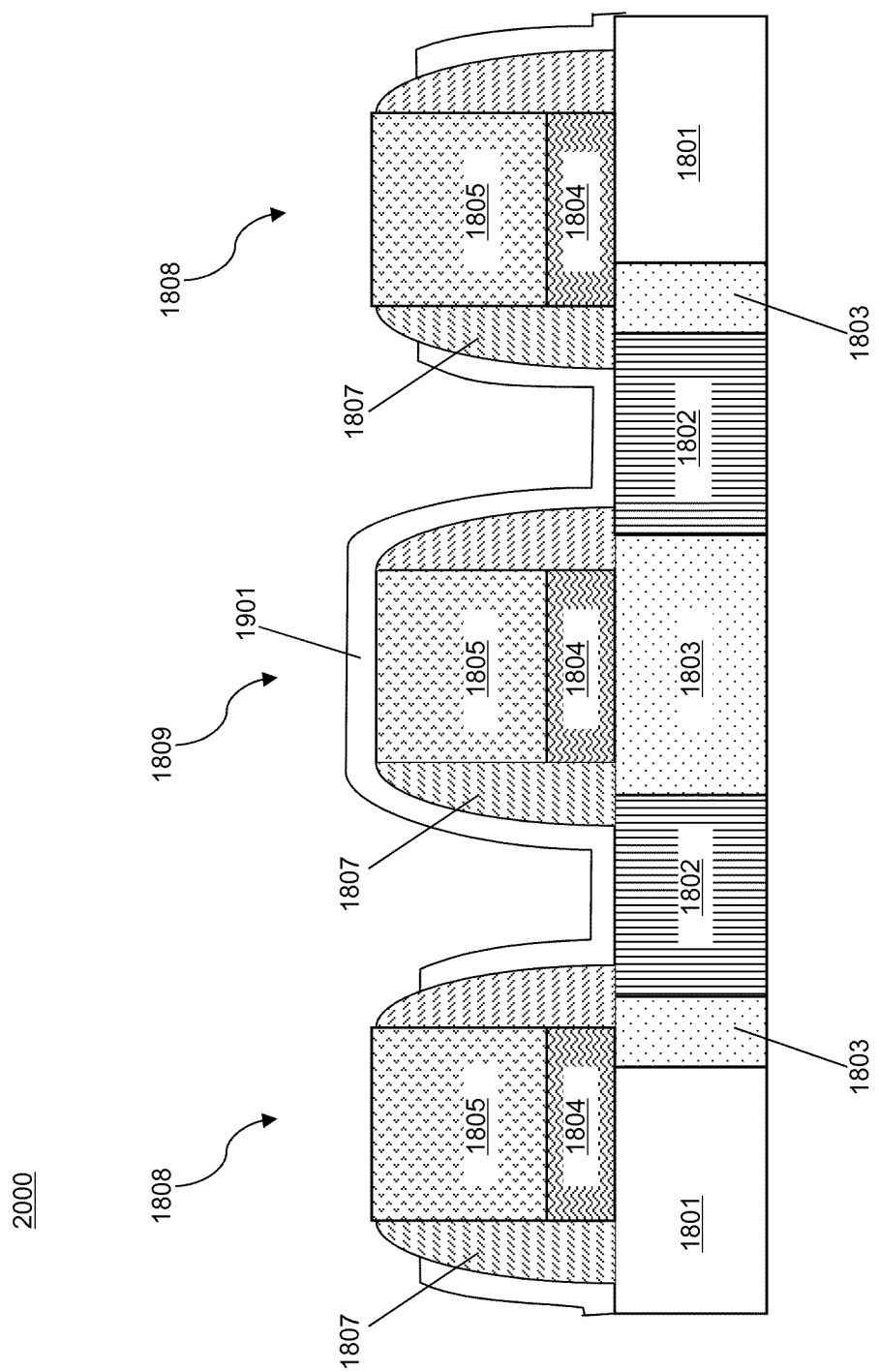
FIG. 20 is a cross sectional view of the device of FIG. 19 after removal of the protective layer from the dummy gates.

Returning to method 1700 of FIG. 17, next, in block 1703, the protective layer is removed from the dummy gates, exposing the tops of the dummy gates for further processing. The protective layer may be removed from the dummy gates using any appropriate masking and etching process, such that the protective layer is not removed from the active gate or source/drain regions during block 1703. In embodiments in which the spacers and the protective layer comprise the same material, a portion of the spacers in the dummy gate may also be removed during removal of the protective layer from the dummy gate, while in other embodiments in which the spacers and the protective layer comprise different materials, the spacers may not be partially removed in the dummy gates. FIG. 20 shows the device 1900 of FIG. 19 after removal of protective layer 1901 from the dummy gates 1808, such that the tops of the dummy gates 1808 are exposed. As shown in device 2000 of FIG. 20, the protective layer 1901 remains on the active gate 1809 and on the source/drain regions 1802.

Figure 21:
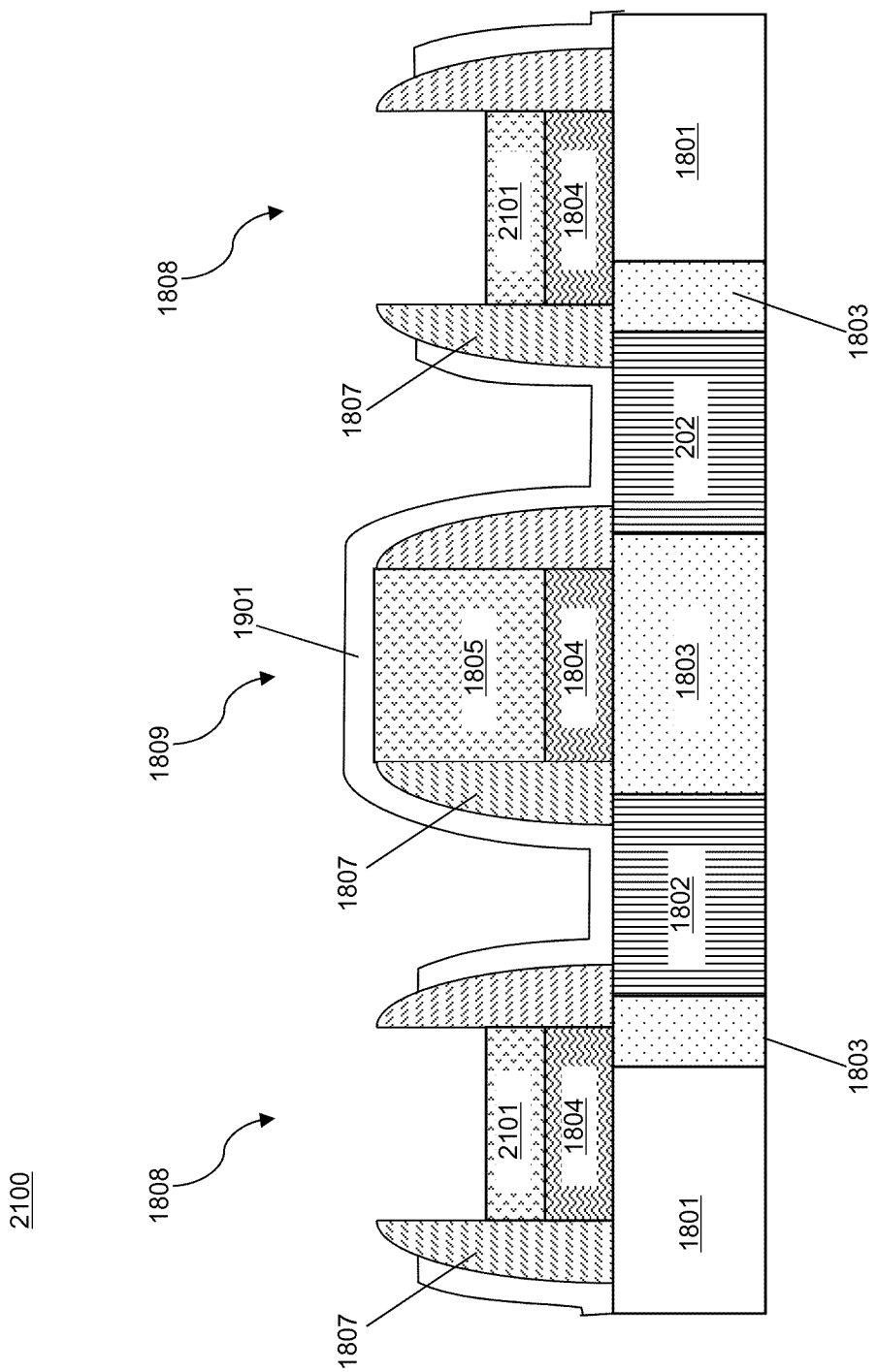
FIG. 21 is a cross sectional view of the device of FIG. 20 after etching of gate polysilicon in the dummy gates.

Flow of method 1700 then proceeds to block 1704, in which the gate polysilicon in the dummy gate is etched. A portion of the gate polysilicon may remain in the dummy gate after the etch of block 1704 in some embodiments. The thickness of the remaining gate polysilicon in the dummy gate may be controlled by the etching time in some embodiments. In other embodiments, an etch stop layer may be included within the gate polysilicon in both the active gate and dummy gate, and the portion of the gate polysilicon that is located on top of the etch stop layer is removed by the etch of the gate polysilicon in the dummy gate. The etch stop layer may comprise TiN in some embodiments. In further embodiments, the gate polysilicon may be fully removed by the etch of block 1704 of FIG. 17. FIG. 21 shows the device 2000 of FIG. 20 after etching of the gate polysilicon 1805 in the dummy gates 1808 to form conductor polysilicon 2101. The thickness of conductor polysilicon 2101 may be determined by the etching time of the etch that is performed in block 1704 of method 1700 in some embodiments, or by the presence of an etch stop layer in the gate polysilicon 1805 in other embodiments. In embodiments that include an etch stop layer within the active and dummy gates, the etch stop layer may also be removed from the dummy gates 1808 during block 1704, leaving conductor polysilicon 2101. The thickness of the conductor polysilicon 2101 may be chosen such that it is capable of being substantially completely converted to a silicide.

Figure 22:
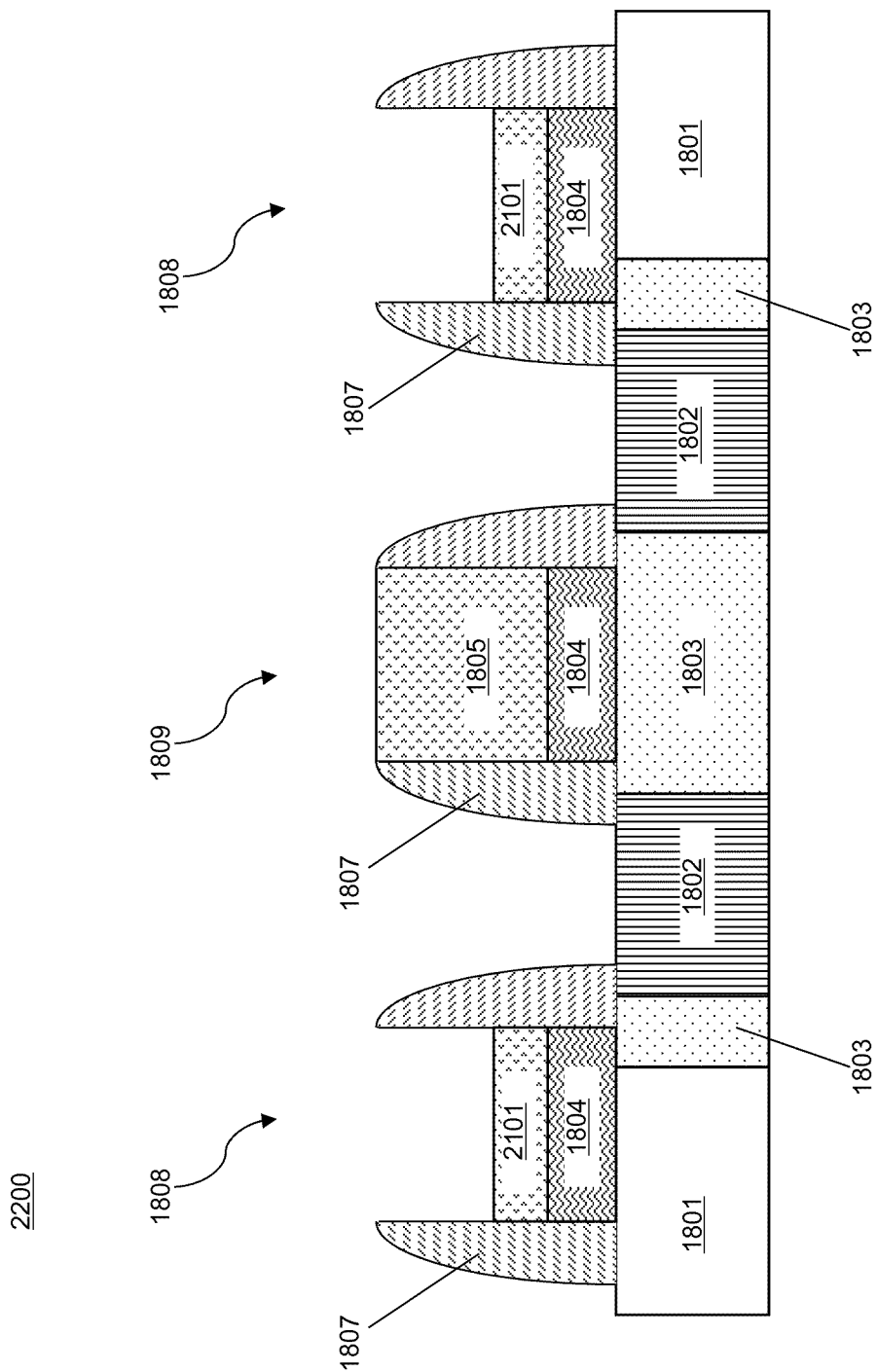
FIG. 22 is a cross sectional view of the device of FIG. 21 after removal of the protective layer from the active gate and the source/drain regions.

Returning to method 1700 of FIG. 17, next, in block 1705, the remaining protective layer is removed from the device, exposing the active gate and the source/drain regions. The remaining protective layer may be removed from the active gate using any appropriate masking and etching process, or selective etching process, such that the etched dummy gate is not affected by removal of the remaining protective layer. In embodiments in which the spacers and the protective layer comprise the same material, a portion of the spacers in the active gate may also be removed during removal of the protective layer from the active gate, while in other embodiments in which the spacers and the protective layer comprise different materials, the spacers may not be partially removed in the active gates. FIG. 22 shows the device 2100 of FIG. 21 after removal of the remaining portion of protective layer 1901, exposing the active gate 1809 and source/drain regions 1802.

Figure 23:
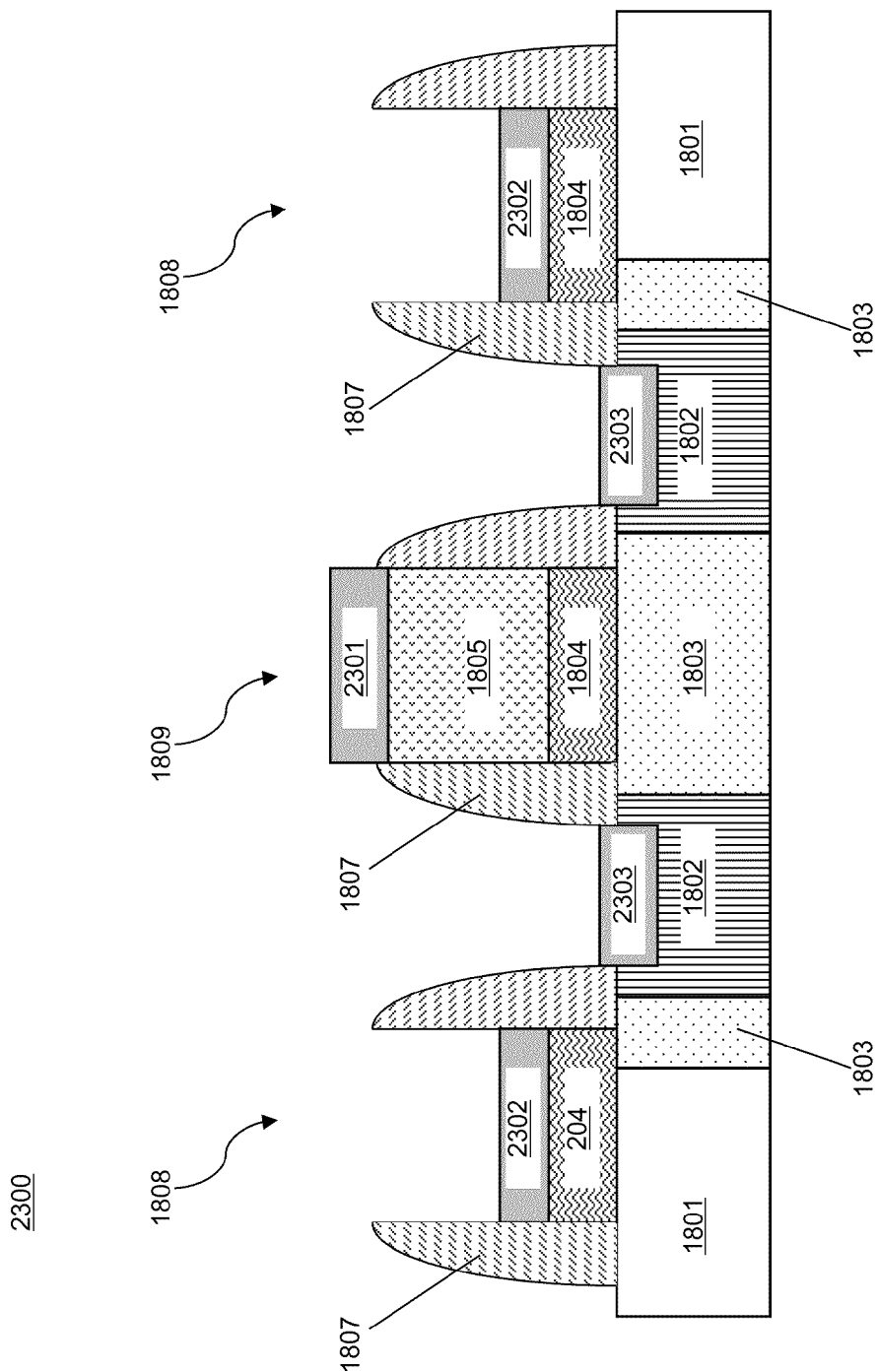
FIG. 23 is a cross sectional view of the device of FIG. 22 after formation of gate silicide in the active gate and conductor silicide in the dummy gates.

Lastly, in block 1706 of FIG. 17, the device is silicided to simultaneously form gate silicide in the active gate and conductor silicide in the dummy gate. In some embodiments, the silicidation process may comprise deposition of a metal (for example, nickel or nickel platinum) over the device, annealing of the device and deposited metal such that the deposited metal reacts with silicon to form silicide, and then removing any unreacted metal. Source/drain silicide is also formed in the source/drain regions in the substrate on either side of the active gate simultaneously with the gate silicide in the active gate and conductor silicide in the dummy gate. FIG. 23 shows the device 2200 of FIG. 22 after formation of gate silicide 2301 in the active gate 1809 and conductor silicide 2302 in the dummy gates 1808. In the active gate 1809, gate silicide 2301 comprises a portion of the gate polysilicon 1805 that is reacted with the deposited metal during the silicidation of block 1706 of FIG. 17. In the dummy gates 1808, conductor polysilicon 2101 (as was shown in FIGS. 21 and 22) is fully consumed by the silicidation to form the conductor silicide 2302, such that conductor silicide 2302 is located directly on top of the gate metal 1804 in the dummy gates 1808. Source/drain silicide 2303 is also formed in source/drain regions 1802 by the silicidation performed during block 1706 of method 1700. The dummy gates 1808, including a conductor comprising gate metal 1804 and conductor silicide 2302, comprise dummy gate interconnects that may be used as local interconnects for the device 2300, and that may used to be transmit any appropriate signals in the finished semiconductor device 2300.

The technical effects and benefits of exemplary embodiments include reduction of reduction in space required for wiring layers, and of dummy gate induced parasitic capacitance, in a semiconductor device.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a semiconductor device comprising a dummy gate interconnect, comprising:
   forming a dummy gate on a substrate, the dummy gate comprising a dummy gate metal layer located directly on top of the substrate, and a dummy gate polysilicon layer located on the dummy gate metal layer;
   forming an active gate on the substrate, the active gate comprising an active gate metal layer located on the substrate, and an active gate polysilicon layer located on the active gate metal layer; and
   etching the dummy gate polysilicon layer to remove at least a portion of the dummy gate polysilicon layer to form the dummy gate interconnect, wherein the active gate polysilicon layer is not etched during the etching of the dummy gate polysilicon layer, and wherein the dummy gate metal layer comprises a conductor of the dummy gate interconnect.

2. The method of claim 1, wherein forming the dummy gate on the substrate further comprises forming a dummy gate cap on top of the dummy gate polysilicon layer; and
   wherein forming the active gate on the substrate further comprises forming an active gate cap on top of the active gate polysilicon layer.

3. The method of claim 2, wherein the dummy gate cap and the active gate cap each comprise nitride.

4. The method of claim 2, further comprising, before etching the dummy gate polysilicon layer:

removing the active gate cap;
siliciding a portion of the active gate polysilicon layer to form an active gate silicide;
forming source/drain silicide in source/drain regions located on either side of the active gate in the substrate simultaneously with forming the active gate silicide;
forming a protective layer over the substrate, wherein the active gate silicide and the dummy gate cap are not covered by the protective layer;
forming a mask over the active gate silicide after forming the protective layer; and
removing the dummy gate cap;
wherein the active gate silicide is protected by the mask and the substrate is protected by the protective layer during the etching of the dummy gate polysilicon layer.

5. The method of claim 1, wherein the active gate polysilicon layer and the dummy gate polysilicon layer each further comprise respective etch stop layers comprising titanium nitride (TiN), wherein the dummy gate polysilicon layer is partially removed by the etching of the dummy gate polysilicon layer such that a remaining portion of the dummy gate polysilicon layer is located under the etch stop layer after the etching of the dummy polysilicon layer, and wherein the portion of dummy gate polysilicon layer that is removed by the etching of the dummy gate polysilicon layer is determined by a location of the respective etch stop layer in the dummy gate polysilicon layer.

6. The method of claim 1, wherein the portion of dummy gate polysilicon layer that is removed by the etching of the dummy gate polysilicon layer is determined by an etch time of the etching of the dummy gate polysilicon layer.

7. The method of claim 1, wherein all of the dummy gate polysilicon layer is removed by the etching of the dummy gate polysilicon layer.

8. The method of claim 1, wherein the dummy gate interconnect does not comprise an active device of the semiconductor device, and wherein the dummy gate metal layer that comprises the dummy gate interconnect transmits a signal between a first active device and a second active device in the semiconductor device.

9. The method of claim 2, further comprising removing the dummy gate cap from the dummy gate before etching the dummy gate polysilicon layer, and wherein the active gate cap protects the active gate polysilicon layer during the etching of the dummy gate polysilicon layer.

10. The method of claim 9, further comprising forming a protective layer over the substrate before etching the dummy gate polysilicon layer, wherein the active gate cap and the dummy gate polysilicon layer are not covered by the protective layer, and wherein the protective layer protects the substrate during the etching of the dummy gate polysilicon layer.

11. The method of claim 10, wherein the protective layer comprises one of a polymer material, oxide, and glass.

12. The method of claim 10, wherein forming the protective layer comprises:
forming an initial layer of a protective layer material over the semiconductor device; and
etching the initial layer to form the protective layer, such that the active gate cap and the dummy gate polysilicon layer are exposed by etching of the initial layer to form the protective layer.

13. The method of claim 10, wherein forming the protective layer comprises:
spin-coating a protective layer material on the substrate to form the protective layer, wherein the protective layer has a thickness that is less than a height of the active gate cap and the dummy gate polysilicon layer.

14. The method of claim 10, further comprising:
removing the active gate cap after etching the dummy gate polysilicon layer;
siliciding a portion of the active gate polysilicon layer to form an active gate silicide; and
siliciding a remaining portion of the dummy gate polysilicon layer to form a conductor silicide simultaneously with forming the active gate silicide, wherein the remaining portion of the dummy gate polysilicon layer is fully consumed by the siliciding such that the conductor silicide is in direct contact with the dummy gate metal layer.

15. The method of claim 14, further comprising:
removing the protective layer before forming the active gate silicide; and
forming source/drain silicide in source/drain regions located on either side of the active gate in the substrate simultaneously with forming the active gate silicide.

16. The method of claim 1, further comprising:
forming a protective layer over the semiconductor device before etching the dummy gate polysilicon layer, wherein the protective layer covers the active gate and the dummy gate, and wherein the protective layer comprises a conformal etch stop material comprising one of oxide and nitride;
removing the protective layer from the dummy gate; and
etching the dummy gate polysilicon layer, wherein the protective layer protects the active gate polysilicon layer and the substrate during the etching of the dummy gate polysilicon layer.

17. The method of claim 16, further comprising:
removing the protective layer from the semiconductor device after etching the dummy gate polysilicon layer;
siliciding a portion of the active gate polysilicon layer to form an active gate silicide;
siliciding a remaining portion of the dummy gate polysilicon layer to form a conductor silicide simultaneously with forming the active gate silicide, wherein the remaining portion of the dummy gate polysilicon layer is fully consumed by the siliciding such that the conductor silicide is in direct contact with the dummy gate metal layer; and
forming source/drain silicide in source/drain regions located on either side of the active gate in the substrate simultaneously with forming the active gate silicide.

* * * * *